(12) United States Patent
Liu

(10) Patent No.: US 9,966,302 B2
(45) Date of Patent: May 8, 2018

(54) DEVICE MANUFACTURE AND PACKAGING METHOD THEREOF

(71) Applicant: TAIWAN SEMICONDUCTOR MANUFACTURING COMPANY LTD., Hsinchu (TW)

(72) Inventor: Chien-Hsuan Liu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 15/424,245

(22) Filed: Feb. 3, 2017

(65) Prior Publication Data

US 2017/0148666 A1  May 25, 2017

Related U.S. Application Data

(62) Division of application No. 14/658,540, filed on Mar. 16, 2015, now Pat. No. 9,595,492.

(51) Int. Cl.
| | |
|---|---|
| *H01L 23/52* | (2006.01) |
| *H01L 23/48* | (2006.01) |
| *H01L 21/768* | (2006.01) |
| *H01L 23/522* | (2006.01) |
| *H01L 23/528* | (2006.01) |
| *H01L 21/027* | (2006.01) |

(52) U.S. Cl.
CPC .... *H01L 21/76816* (2013.01); *H01L 21/0274* (2013.01); *H01L 21/76877* (2013.01); *H01L 23/528* (2013.01); *H01L 23/5226* (2013.01)

(58) Field of Classification Search
CPC ........... H01L 21/76816; H01L 23/5226; H01L 23/49827; H01L 23/481; H01L 23/528; H01L 21/76877; H01L 23/49838; H01L 2224/49175
See application file for complete search history.

(56) References Cited

U.S. PATENT DOCUMENTS

| | | | |
|---|---|---|---|
| 2002/0093105 A1 | 7/2002 | Jeon et al. | |
| 2006/0019414 A1 | 1/2006 | Wang et al. | |
| 2015/0130074 A1* | 5/2015 | Kim | ........... H01L 21/76877 257/774 |

FOREIGN PATENT DOCUMENTS

CN         1728354 A        2/2006

OTHER PUBLICATIONS

Office action issued by the China Intellectual Property Office dated Dec. 28, 2017 for application 201510477556.4.
US 20060019414 is the counterpart to CN 1728354A.

* cited by examiner

*Primary Examiner* — Jasmine Clark
(74) *Attorney, Agent, or Firm* — WPAT, P.C., Intellectual Property Attorneys; Anthony King

(57) ABSTRACT

Some embodiments of the present disclosure provide a semiconductive device. The semiconductive device includes a first conductive layer and a second conductive layer above the first conductive layer. The second conductive layer includes a first portion and a second portion protruding from the first portion. A via structure is under the second conductive layer and on top of the first conductive layer. The via structure is substantially aligned vertically with the second portion.

20 Claims, 25 Drawing Sheets

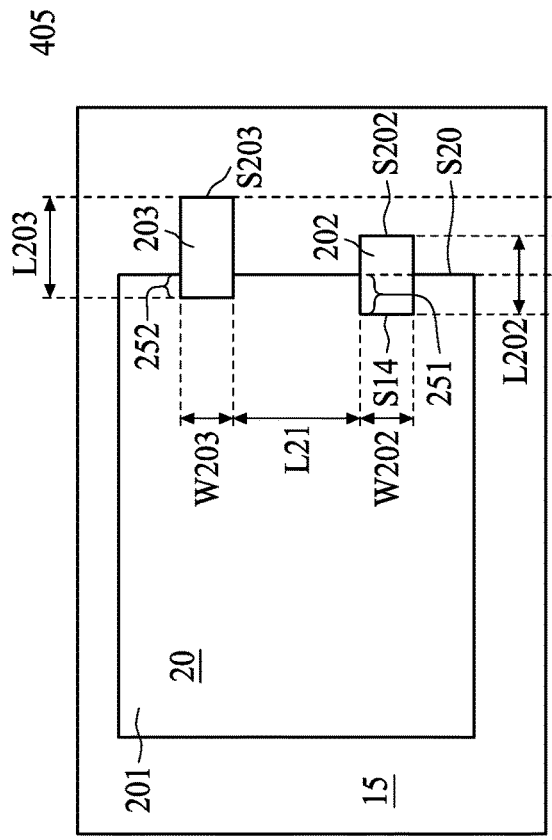
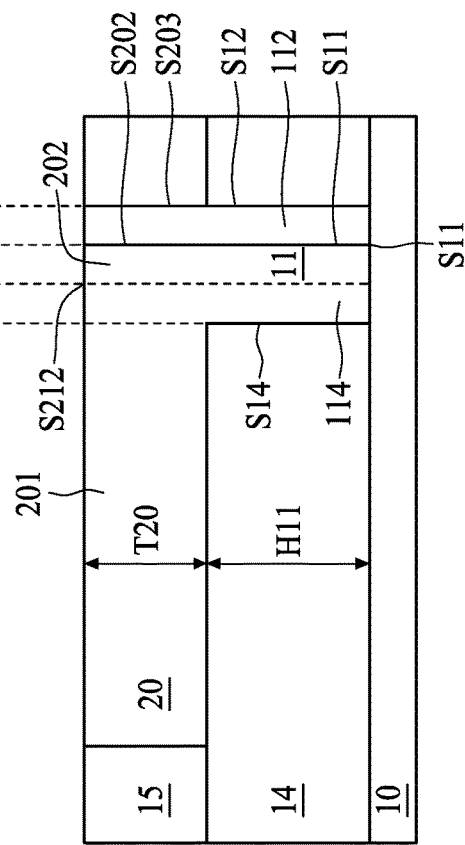
FIG. 4A
FIG. 4B

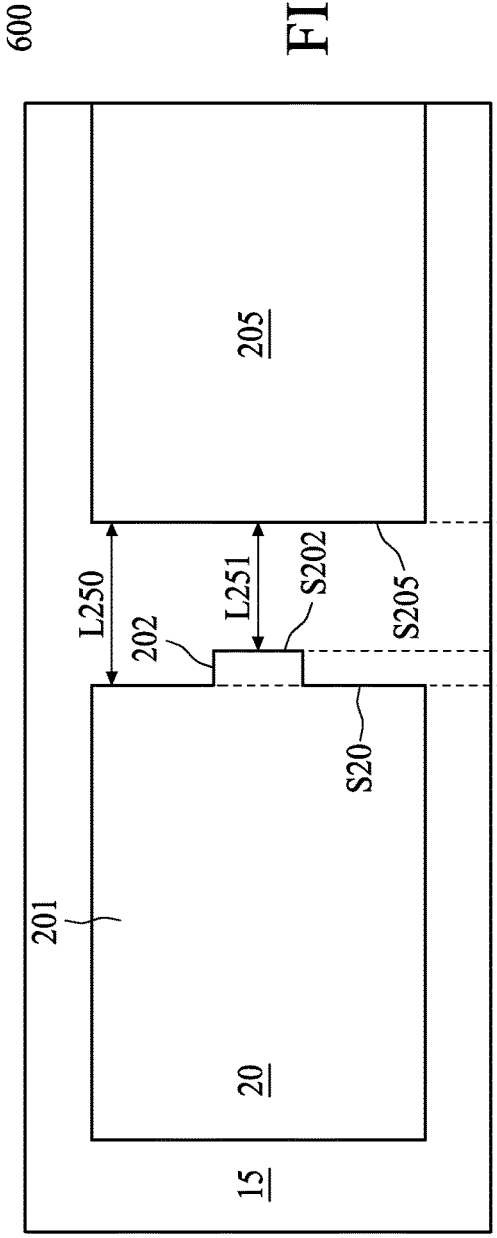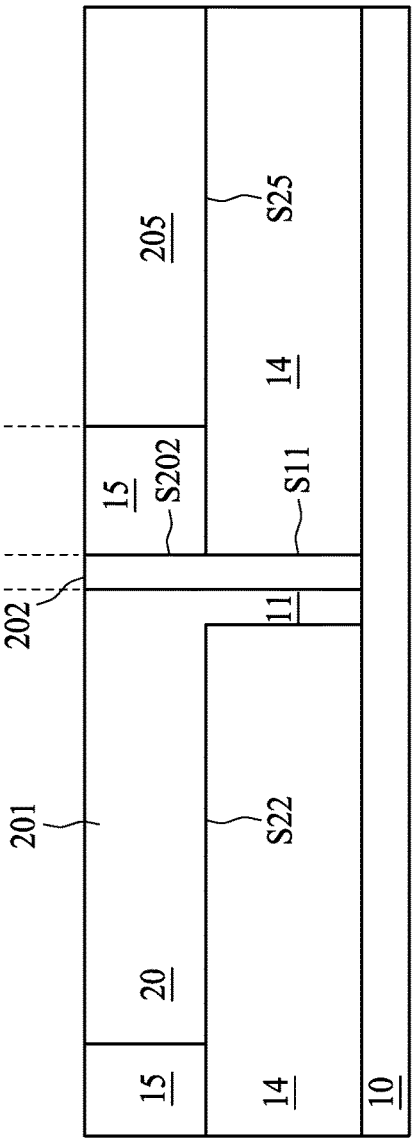

DEVICE MANUFACTURE AND PACKAGING METHOD THEREOF

CROSS REFERENCE TO RELATED APPLICATIONS

This application claims the benefit of prior-filed application Ser. No. 14/658,540, filed Mar. 16, 2015, which is a divisional application of application Ser. No. 14/658,540, filed Mar. 16, 2015, now U.S. Pat. No. 9,595,492, under 35 U.S.C. 120.

BACKGROUND

Various processing are used to fabricate integrated circuits on a semiconductor wafer. These processes include deposition of a conducting layer on wafer substrate; formation of a photoresist or other mask in the form of interconnection pattern, using lithographic or photolithographic techniques; and subjecting the wafer substrate to a dry etching process to remove the conducting layer from the areas not covered by the photoresist or mask.

These processes are performed to meet a suitable standard of manufacturing. The processes are adjusted or modified to improve qualities or performance of integrated circuits on the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 4A, 4B, 6A, 6B, 7A, 7B, 25A, and 25B are top views and cross-sectional views of a semiconductor device, in accordance with some embodiments of the present disclosure.

DETAILED DESCRIPTION

Figure 1:
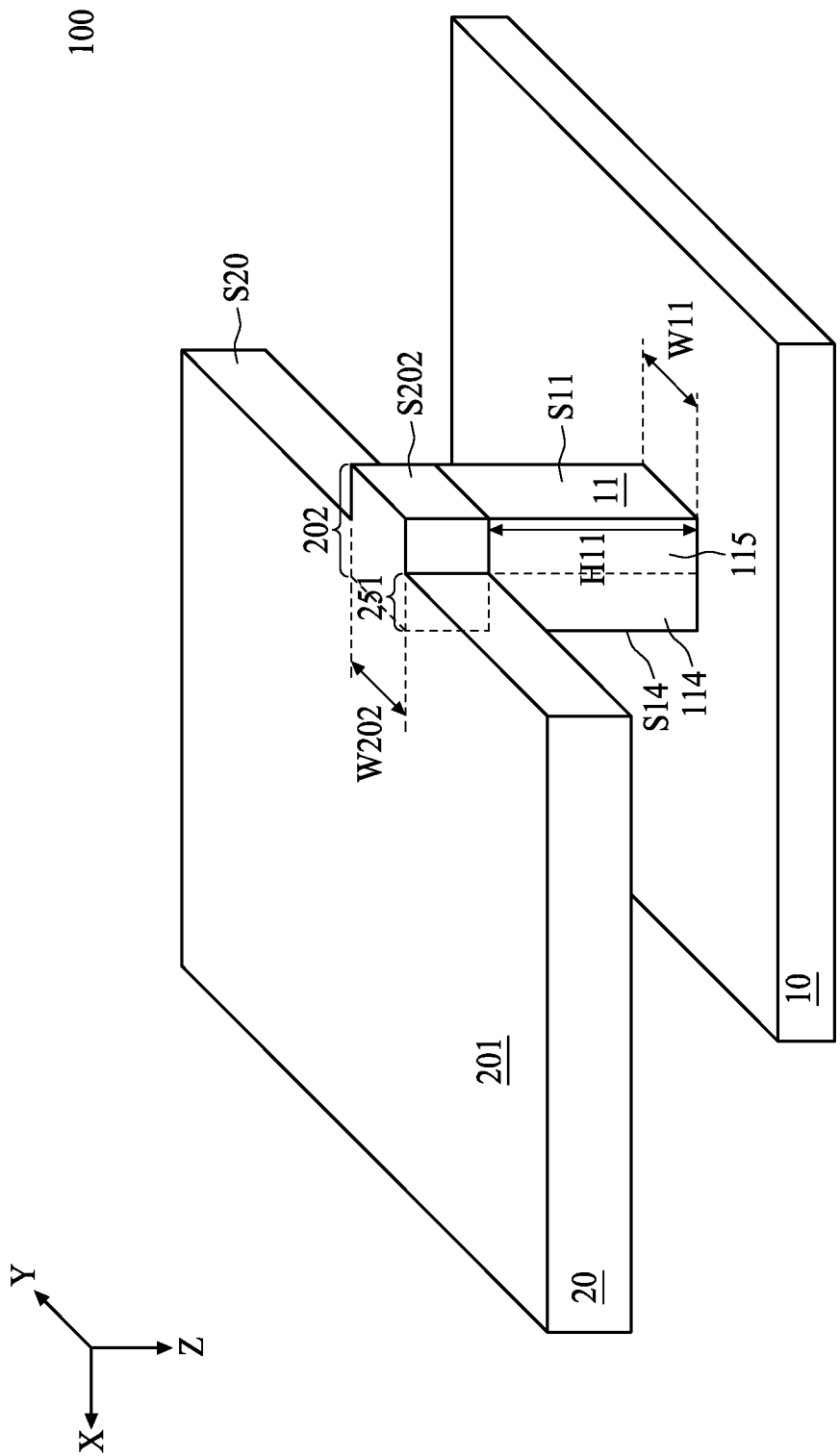
FIGS. 1, 3, 5, and 22 are diagrammatic perspective views of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical proximity effects are caused by light diffraction and interference between closely spaced features on a reticle, the widths of lines in a lithographic image are affected by other nearby features. Tightly grouped features will print with a different size than isolated lines, although both have the same linewidth dimension on the reticle. This effect is referred to as iso-dense bias. Optical proximity effects may lead to shortened line features, non-uniform critical dimensions, or rounded corners. To compensate for optical proximity effects, selective image size biases are introduced into a reticle pattern. The selective image size bias is an optical proximity correction (OPC). Computer algorithms are used for generating optical proximity corrections on the reticle pattern. For an OPC to enlarge the selective image size of the reticle pattern, tightly grouped features of an ultra-thick metal tends to print too closely and induced a risk of bridging or connecting the tightly grouped features. Therefore, a separation between the selective image sizes of the reticle pattern is to be sufficiently large to avoid the bridging.

The separation is not to be too large such that the ultra-thick metal is not sufficiently etched and thus blocking a complete removal of an underlying etch stop layer. An incomplete removal of said etch stop layer may lead to disconnection between the ultra-thick metal at a top and a conductive layer at a bottom.

A modification on a shape of the reticle pattern is introduced to correct the optical effect and a bridging effect. The reticle pattern includes a body portion and a protruding portion such that tightly grouped features are separated by a sufficient distance and the protruding portion causing sufficient etching of the ultra-thick metal such that the underlying etch stop layer are removed to allow connection between the ultra-thick metal at the top and the conductive layer at a bottom.

FIG. 1 illustrates a diagrammatic perspective view of a semiconductive device 100. The semiconductive device 100 includes a bottom conductive layer 10, a top conductive layer 20, and a via structure 11. In some embodiments, bottom conductive layer 10 is a first conductive layer 10. Top conductive layer 20 is a second conductive layer 20.

A coordinate system with arrows pointing in three directions X, Y, and Z is illustrated. Direction X, direction Y, and direction Z are orthogonal to each other. Direction Y is substantially parallel along lateral edge S20 of body portion 201. Direction Z is substantially parallel along height H11 of via structure 11. Direction X is substantially orthogonal to lateral edge S20 of body portion 201.

The via structure 11 is composed of a conductive material similar to a material in the top conductive layer 20. In some embodiments, bottom conductive layer 10 is composed of a conductive material similar to the material in the top conductive layer 20 or via structure 11.

In some embodiments, bottom conductive layer 10 is above a semiconductive substrate (not shown). Top conductive layer 20 is above bottom conductive layer 10. Via structure 11 is between top conductive layer 20 and bottom conductive layer 10. Via structure 11 is electrically coupled between top conductive layer 20 and bottom conductive layer 10.

Via structure 11 is on top of bottom conductive layer 10. Via structure 11 is in contact with bottom conductive layer 10 such that via structure 11 is electrically coupled with the bottom conductive layer 10. Via structure 11 includes a lateral side S11. Via structure 11 is below top conductive layer 20. Top conductive layer 20 includes a body portion 201 and a protruding portion 202. In some embodiments, body portion 201 is substantially larger than protruding portion 202. Body portion 201 is also a first portion 201. Protruding portion 202 is also a second portion 202. Protruding portion 202 is protruding from body portion 201.

Via structure 11 is under protruding portion 202. Via structure 11 is partially under top conductive layer 20 proximate to a lateral edge S20 of top conductive layer 20. Protruding portion 202 includes a lateral boundary S202. Lateral boundary S202 is protruding from lateral edge S20. Lateral boundary S202 is in contact with lateral side S11 of via structure 11. In some embodiments, lateral boundary S202 is parallel with lateral side S11. Lateral boundary S202 is vertically aligned with lateral side S11. Lateral boundary S202 is vertically coplanar with lateral side S11. Via structure 11 is substantially aligned vertically with the protruding portion 202. Body portion 201 is partially overlapping with the protruding portion 202. An overlapping portion 251 is between protruding portion 202 and body portion 201. A back portion 114 of via structure 11 is under overlapping portion 251 of top conductive layer 20. Front portion 115 of via structure 11 is under protruding portion 202 of top dielectric layer 20. In some embodiments, the via structure 11 and the top conductive layer 20 may not be perfectly faceted due to OPE.

In some embodiments, first portion 201 is substantially larger than second portion 202. Lateral side S11 of the via structure 11 is in contact with the bottom conductive layer 10 and with the top conductive layer 20. Protruding portion 202 includes a width W202. Width W202 is also a width of side S14. Via structure 11 includes a width W11. Width W11 is measured parallelly with width W202. In some embodiments, width W202 is substantially equal to width W11. In some other embodiments, width W202 is larger than width W11.

Figure 2A:
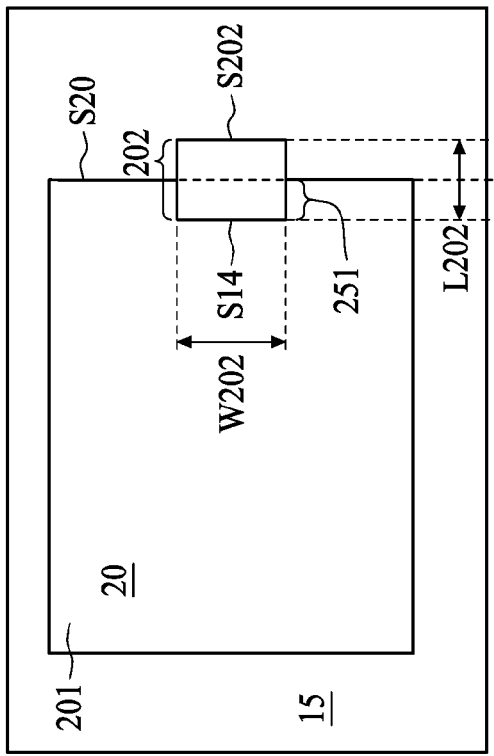
Figure 2B:
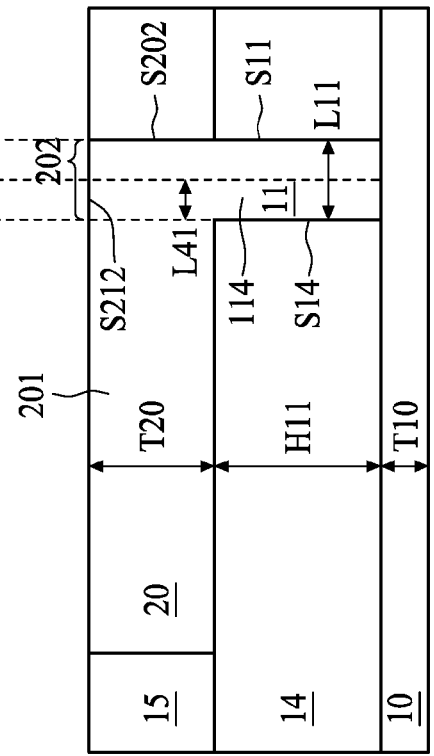

A top view, FIG. 2A, of semiconductive device 200 viewing in a direction Z, and a cross sectional view, FIG. 2B are illustrated, of semiconductive device 200 is aligned with the top view. The cross sectional view is viewing in direction Y. Direction Y is substantially parallel with width W202.

In FIGS. 2A and 2B, lateral boundary S202 is aligned vertically with the lateral side S11 of the via structure 11. Lateral edge S20 is a side of body portion 201 in proximity to via structure 11.

Top conductive layer 20 is composed of a material similar to the material in via structure 11 or bottom conductive layer 10. Top conductive layer 20 is an ultra-thick metal. The ultra-thick metal includes a thickness T20. Thickness T20 is measured along direction Z. Direction Z is substantially parallel with lateral side S11. Thickness T20 is more than about 2 micrometers. In some embodiments, thickness T20 is in a range from around 2 to 4 micrometers. Bottom conductive layer 10 includes a thickness T10. In some embodiments, thickness T10 is substantially smaller than thickness T20. A ratio between thickness T20 and thickness T10 is substantially larger than 1. Bottom dielectric layer 14 is under top conductive layer 20. Bottom dielectric layer 14 is over bottom conductive layer 10. Bottom dielectric layer 14 is surrounding via structure 11. Via structure 11 is in bottom dielectric layer 14. Via structure 11 includes a height H11. Height H11 is measured along direction Z. Height H11 is substantially equal to a thickness of bottom dielectric layer 14. Bottom dielectric layer 14 or top dielectric layer 15 includes one or more dielectric material, such as undoped silicon glass (USG), boron phosphorous silicate glass (BPSG), plasma enhanced tetra-ethyl-ortho-silicate (PE-TEOS), or any other suitable dielectric materials.

In some embodiments, thickness T20 is substantially larger than height H11. A ratio between thickness T20 and height H11 is substantially larger than 1. In some embodiments, thickness T10 is substantially smaller than height H11. A ratio between thickness T10 and height H11 is substantially lesser than 1.

Top dielectric layer 15 is on top of bottom dielectric layer 14. Top dielectric layer 15 is surrounding top conductive layer 20. Top conductive layer 20 is substantially coplanar with top dielectric layer 15. Top dielectric layer 15 includes a thickness substantially equal to thickness T20. In some embodiments, top dielectric layer 15 is composed of a dielectric material similar to a dielectric material in the bottom dielectric layer 14.

Protruding portion 202 includes a length L202 measured from lateral boundary S202 to a side S14 of via structure 11. In some embodiments, length L202 is a maximum distance measured along direction X. In some embodiments, length L202 is substantially equal to a length L11 of via structure 11. Length L11 is measured along direction X. In some other embodiments, length L202 is larger than length L11. Overlapping portion 251 is in contact with back portion 114 of via structure 11. Back portion 114 includes a length L41 from lateral edge S20 to side S14 of back portion 114. Length L41 is measured along direction X. Length L41 is also a length of overlapping portion 251. Overlapping portion 251 includes a width substantially equal to width W202 of protruding portion 202. Width W202 is measured along direction Y. A product between width W202 and length L202 is an area of a top surface S212 of protruding portion 202. A product between width W202 and length L41 is an area of a top surface of overlapping portion 251. In some embodiments, the via structure 11 and the top conductive layer 20 may not be perfectly faceted due to OPE.

Figure 3:
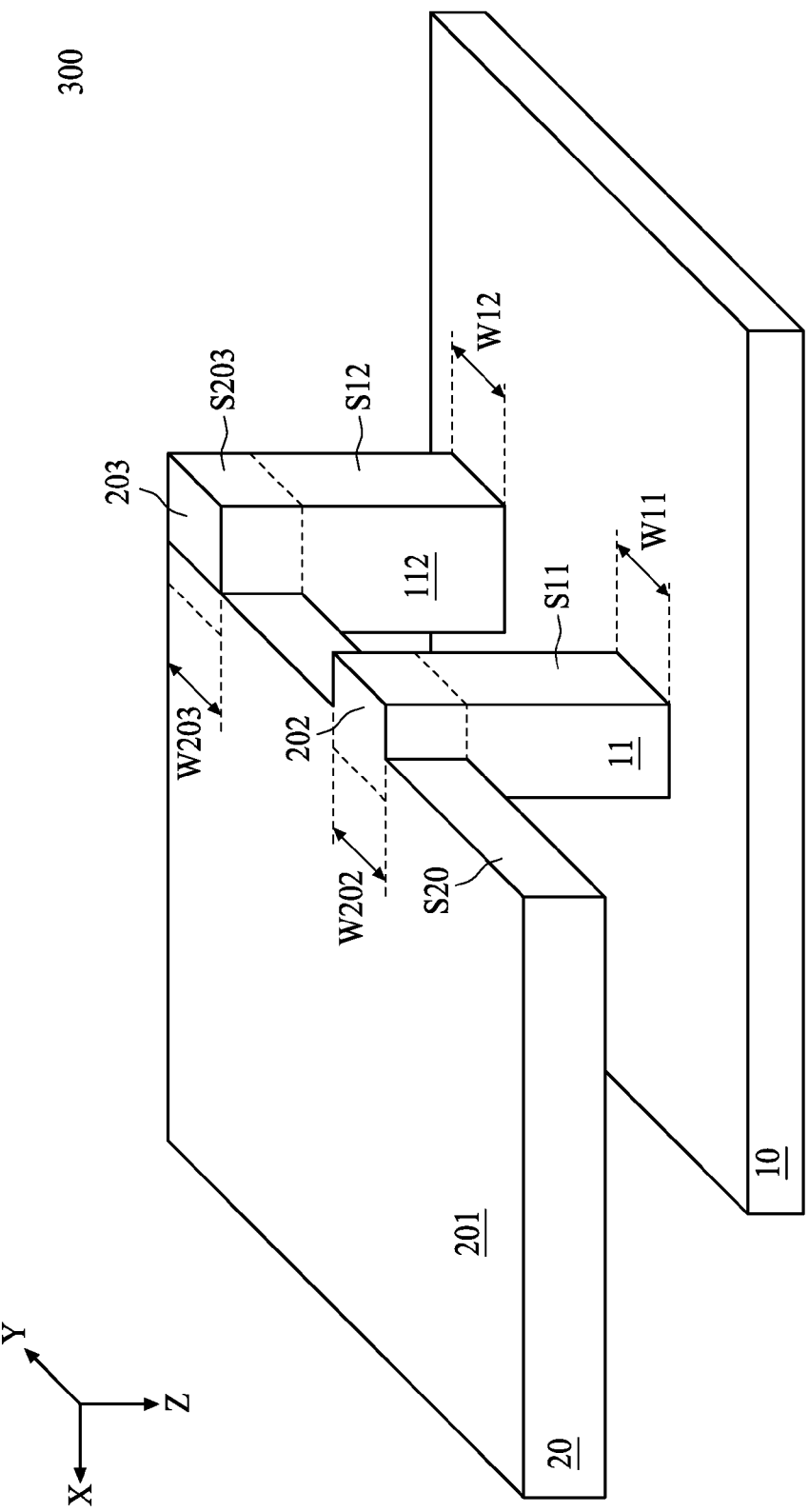

FIG. 3 illustrates a diagrammatic perspective view of semiconductive device 300. In FIG. 3, in some embodiments, a plurality of via structures 11 is disposed in proximity to lateral edge S20. In some embodiments, via structures 11 are different from each other. Via structure 11 or 112 includes different width W11 or W12, respectively. In some embodiments, protruding portion 202 or 203 above via structures 11 or 112 includes different width W202 or W203 respectively. Protruding portion 203 includes a lateral boundary S203. A total area of lateral boundary S203 is different from a total area of lateral boundary S202. A top surface of protruding portion 203 is disposed differently from a top surface of protruding portion 202. In some embodiments, the via structure 11 and the top conductive layer 20 may not be perfectly faceted due to OPE.

A top view, FIG. 4A, of semiconductive device 405 viewing in a direction Z, and a cross sectional view, FIG. 4B, are illustrated, of semiconductive device 405 is aligned with the top view. The cross sectional view is viewing in direction Y.

Protruding portion 203 is different from protruding portion 202. Protruding portion 203 includes an overlapping portion 252. Overlapping portion 252 is covering over another via structure 112. Overlapping portion 252 is misaligned with overlapping portion 251. Protruding portion 203 includes a length L203. Length L203 is different from length L202 of protruding portion 202. An area of a top surface of protruding portion 203 is a product of length L203 and width W203. The area of the top surface of protruding portion 203 is different from the area of the top surface of the protruding portion 202. Lateral boundary S202 of protruding portion 202 and lateral boundary S203 of protruding portion 203 are misaligned. Lateral boundary S203 is aligned vertically with lateral side S12 of via structure 112. Lateral side S12 is misaligned with lateral side S11 of via structure 11. Via structure 112 and via structure 11 are misaligned.

A distance L21 is between protruding portion 202 and protruding portion 203. Distance L21 is measured along lateral edge S20. Distance L21 is measured parallel to direction Y. In some embodiments, a minimum of distance L21 is predetermined such that a minimum distance between different protruding portion 202 and/or 203 is predetermined. In some embodiments, distance L21 is a predetermined spacing between different via structure 11 and/or 112.

In some embodiments, a thickness of protruding portion 203 is substantially the same as a thickness of protruding portion 202. The thickness of protruding portion 203 is substantially the same as thickness T20 of body portion 201. A height of via structure 112 is substantially the same as height H11 of via structure 11. Top dielectric layer 15 is surrounding protruding portion 203 and protruding portion 202. In some embodiments, the via structure 11 and the top conductive layer 20 may not be perfectly faceted due to OPE.

Figure 5:
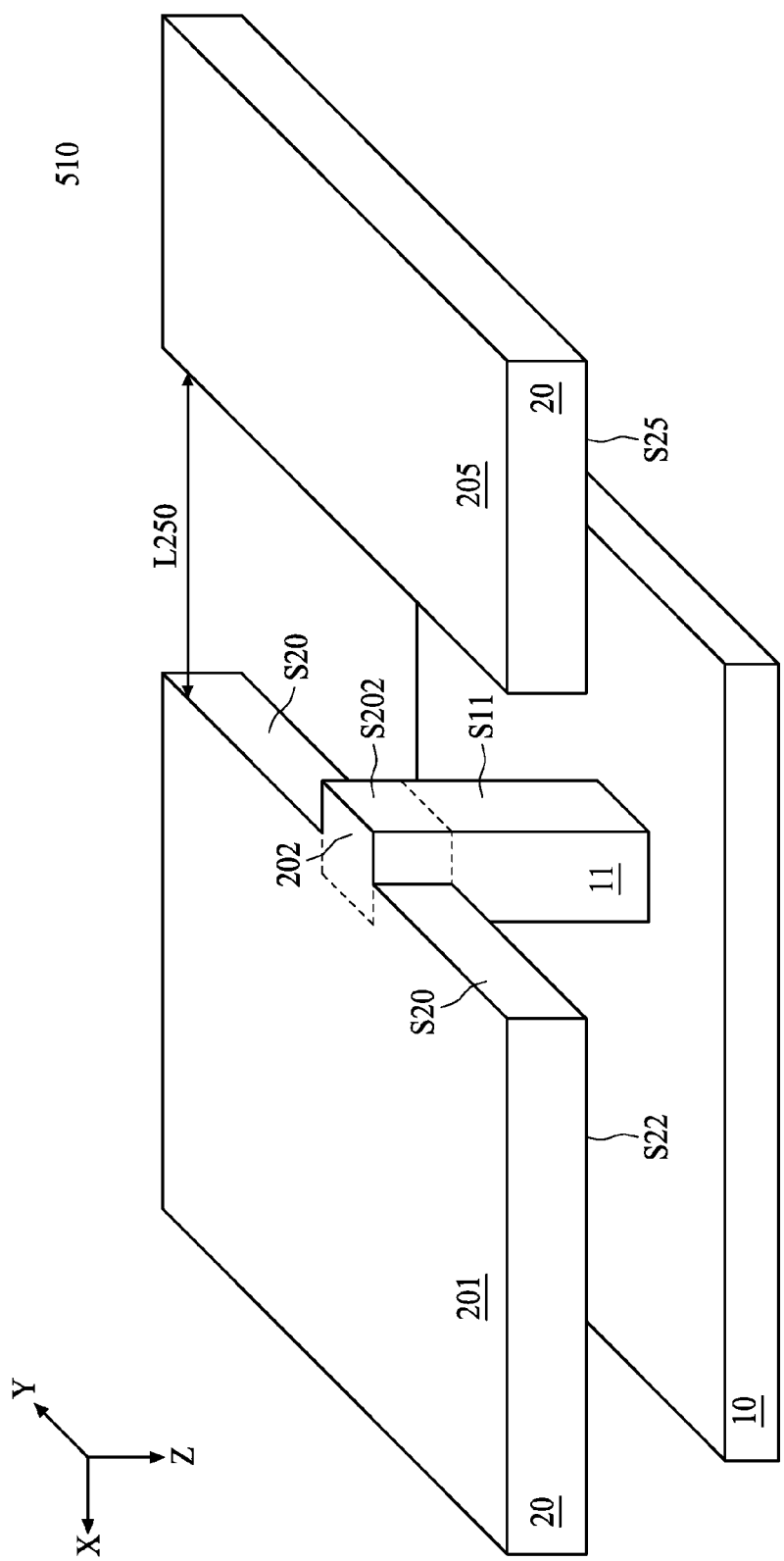

FIG. 5 illustrates a diagrammatic perspective view of semiconductive device 510. Top conductive layer 20 includes region 205. Region 205 is substantially parallel horizontally with body portion 201 of top conductive layer 20. A bottom surface S22 of body portion 201 is substantially coplanar with a bottom surface S25 of region 205. Region 205 is orthogonal with direction Z. Region 205 is also referred to as third portion 205. Region 205 is distanced from lateral edge S20 of body portion 201 by a predetermined distance L250. In some embodiments, the via structure 11 and the top conductive layer 20 may not be perfectly faceted due to OPE.

A top view, FIG. 6A, of semiconductive device 600 viewing in a direction Z, and a cross sectional view, FIG. 6B, are illustrated, of semiconductive device 600 is aligned with the top view. The cross sectional view is viewing in direction Y.

Region 205 is disposed similarly with body portion 201 in top dielectric layer 15. Top dielectric layer 15 is between region 205 and body portion 20. Region 205 is on top of bottom dielectric layer 14. Region 205 includes a lateral surface S205. Lateral surface S205 of region 205 is distanced from lateral boundary S202 of protruding portion 202 by a predetermined length L251. Lateral surface S205 of region 205 is opposite of lateral edge S20 of body portion 201. In some embodiments, a ratio is between length L250 and L251. In some embodiments, lateral surface S205 or lateral edge S20 is a curve such that length L250 is variable at different location in lateral surface S205. Length L250 or length L251 is measured along a direction parallel with direction X. in some embodiments, length L250 or length L251 includes a minimum limit. A ratio is between the minimum limits of length L250 and length L251. The minimum limit is in a predetermined range to prevent protruding portion 202 in contact with region 205. Length L250 or length L251 is predetermined to be at least larger than the minimum limit to prevent electrical coupling between body portion 201 and region 205. In some embodiments, the via structure 11 and the top conductive layer 20 may not be perfectly faceted due to OPE.

Figure 7A:
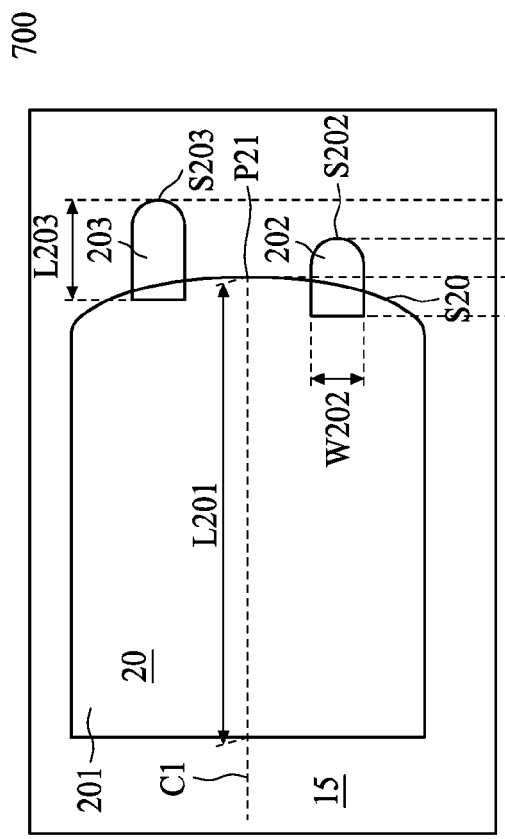
Figure 7B:
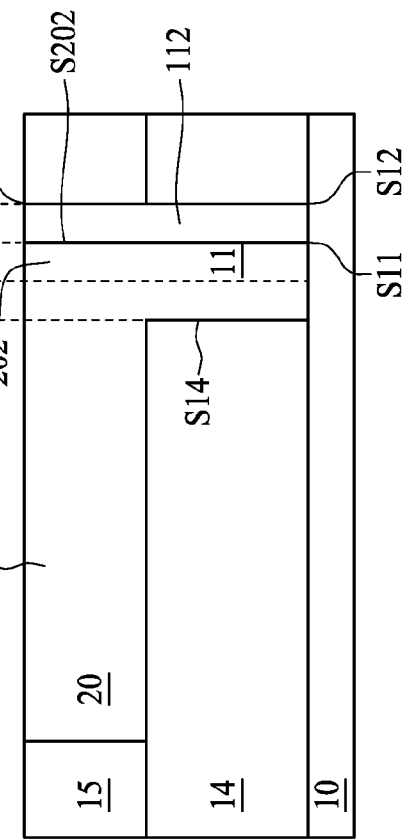

A top view, FIG. 7A, of semiconductive device 700 viewing in a direction Z, and a cross sectional view, FIG. 7B, are illustrated, of semiconductive device 700 is aligned with the top view. The cross sectional view is viewing in direction Y. In FIGS. 7A and 7B, in some embodiments, lateral edge S20 is a curve including rounded corner in a top view. In some embodiments, the via structure 11 and the top conductive layer 20 may not be perfectly faceted due to OPE. In some embodiments, the curve of lateral edge S20 is symmetric about a central line C1 of top conductive layer 20. Central line C1 is parallel with direction X. Central line C1 is crossing through a middle of body portion 201. A length L201 of body portion 201 is from a tip P21 of the curvature of lateral edge S20 to a side of body portion 201 opposite of lateral edge S20. Line L1 is tangent to the curvature of lateral edge S20 at the tip P21 of the curvature. Direction Y is substantially parallel with line L1. A curved boundary of lateral edge S20 intersects with lateral boundary S202 of the protruding portion 202. Protruding portion 202 or 203 also includes lateral boundary S202 or S203 in a shape of a round curve. Lateral boundary S202 includes length L202 from a tip of the curvature of lateral boundary S202 to side S14 of via structure 11. Via structure 11 under protruding portion 202 also includes lateral side S12 in a round curve. Lateral side S12 is curved conformally following a curvature similar to a curvature of lateral boundary S202. A top surface S212 of protruding portion 202 is enclosed by lateral boundary S202.

Figure 8:
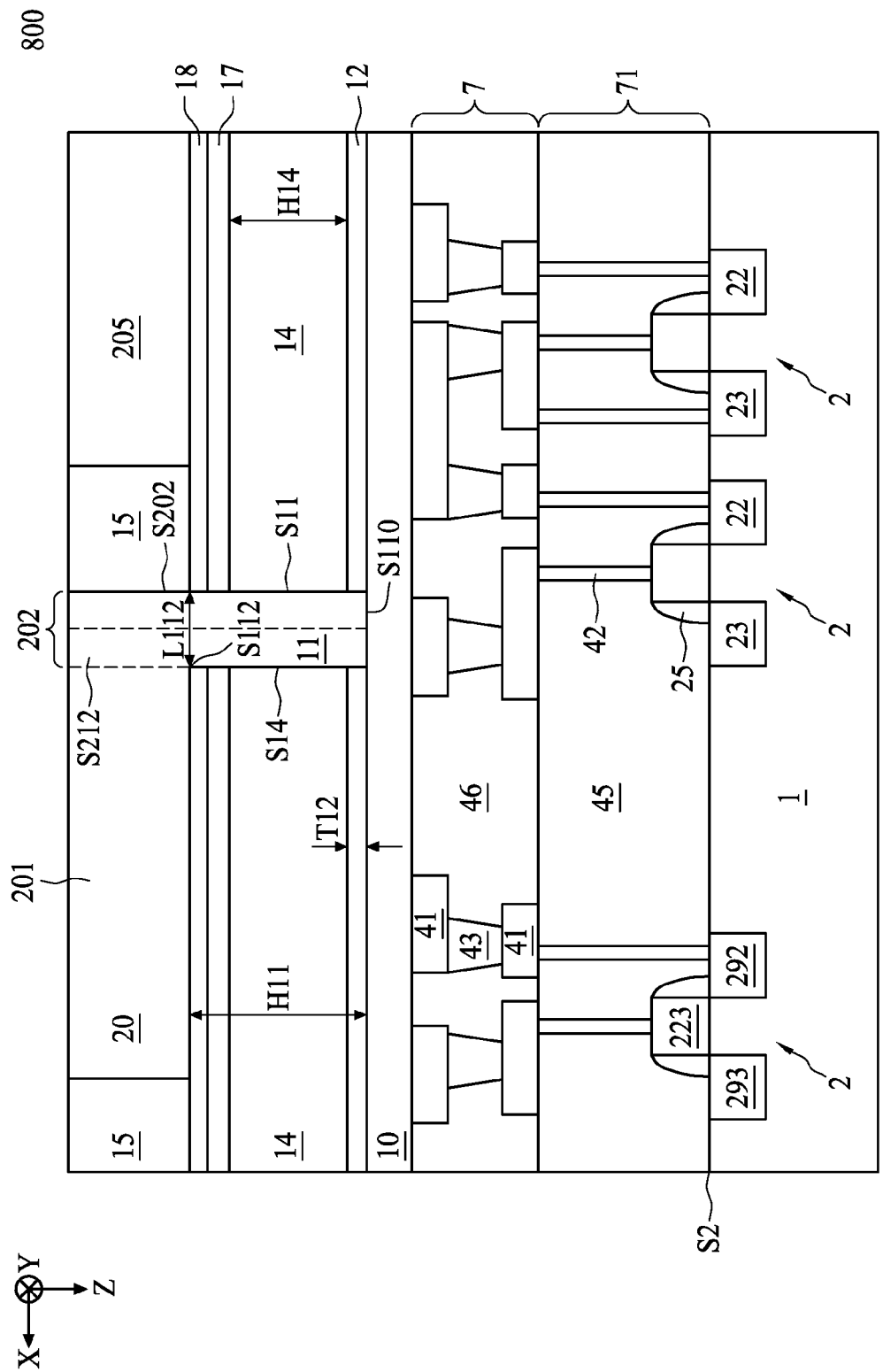
FIG. 8 is a cross-sectional view of a semiconductor device, in accordance with some embodiments of the present disclosure.

FIG. 8 illustrate a cross sectional view of semiconductive device 800. In some embodiments, semiconductive device 800 includes additional layers such as a protective layer 12 between bottom conductive layer 10 and bottom dielectric layer 14. In some embodiments, the protective layer 12 is composed of nitride materials. The protective layer 12 is over the bottom conductive layer 10 and surrounding the via structure 11 in proximity to the bottom conductive layer 10. Via structure 11 penetrates through protective layer 12 to reach bottom conductive layer 10. Via structure 11 is in contact with bottom conductive layer 10 such that via structure 11 is electrically couple with bottom conductive layer 10. Protective layer 12 includes a thickness T12. In some embodiments, thickness T12 is substantially less than height H11 of via structure 11. A surface S110 is an interface between via structure 11 and bottom conductive layer 10. A predetermined ratio is between thickness T12 and the area of surface S110. Surface S110 is orthogonal to direction Z substantially coplanar with a top surface of bottom conductive layer 10.

In some embodiments, an area of surface S110 is substantially the same as the area of the top surface of protruding portion 202. A surface S112 is an interface between via structure 11 and protruding portion 202 of top conductive layer 20. Surface S112 is orthogonal to direction Z and substantially parallel with surface S110 or top surface S212. Surface S112 includes a length L112 measured from lateral side S11 to side S14. In some embodiments, an area of surface S112 is substantially equal to or larger than the area of surface S110. An area of a top surface S212 of protruding portion 202 is substantially the same as the area of surface S112. Lateral boundary S202, lateral side S11, or side S14 is substantially orthogonal to surface S110, surface S112, or top surface S212. Lateral boundary S202, lateral side S11, or side S14 is substantially parallel to direction Z.

Etch stop layer 17 is on top of bottom dielectric layer 14. Barrier layer 18 is on top of etch stop layer 17. Etch stop layer 17 or barrier layer 18 is surrounding via structure 11. Via structure 11 passing through etch stop layer 17 and barrier layer 18. Surface S112 is proximately coplanar with a bottom surface of top conductive layer 20. The top surface of barrier layer 18 is in contact with the bottom surface of top conductive layer 20 and top dielectric layer 15. Top conductive layer 20 is on top of barrier layer 18 or over etch stop layer 17. Height H11 is from surface S112 in barrier layer 18 to surface S110 of bottom conductive layer 10. A ratio is between height H11 of via structure 11 and height H14 of bottom dielectric layer 14.

In some embodiments, redistribution layer 7 or interlayer dielectric (ILD) layer 71 is under bottom conductive layer 10. Redistribution layer 7 is above ILD layer 71. Redistribution layer 7 includes via 43, interconnection 41, and dielectric layer 46. ILD layer 71 includes dielectric layer 45, contact 42, and gate structure 223.

In ILD layer 71, transistor 2 is connected with the source or drain region 292 or 293 at a top side S2 of the semiconductive substrate 1. Transistor 2 includes a gate structure 223 and gate spacer 25 above top side S2. An interconnection 41 coupled with the transistor 2 through a contact 42. In some embodiments, the transistor 2 is for transferring data from a corresponding source or drain region 292 or 293 to external circuitry. In some embodiments, additional transistors with various functions are also included in semiconductive substrate 1.

The ILD layer 71 is on top side S2. ILD layer 71 is above semiconductive substrate 1. Contacts 42 are buried inside dielectric layer 45. Contacts 42 are connected with gate structure 223, source or drain region 292 or 293 of transistor 2.

Contacts 42 are connected to interconnection 41 in a redistribution layer. Redistribution layer 7 is over the dielectric layer 45 and the contacts 42 in the ILD layer 71. The redistribution layer 7 includes alternating some interconnections 41 and some dielectric layers 46. The interconnections 41 are coupled to some other devices (not shown). The interconnection 41 is coupled to another interconnection 41 in other layer through a via 43. In some embodiments, via 43 is composed of a material similar to the material in via structure 11 or contact 42. In some embodiments, dielectric layer 45 or 46 is composed of a material similar to the material in bottom dielectric layer 14 or top dielectric layer 15.

The ILD layer 71 includes dielectric layer 45 made of material such as, boron phosphorous silicate glass (BPSG), plasma enhanced tetra-ethyl-ortho-silicate (PE-TEOS), or any other suitable dielectric materials. In some embodiments, contact 42, interconnection 41, via 43, via structure 11, top conductive layer 20, or region 205 is made of conductive materials such as aluminum, copper, titanium nitride, tungsten, titanium, tantalum, tantalum nitride, nickel silicide, cobalt silicide, TaC, TaSiN, TaCN, TiAl, TiAlN, other suitable materials, and/or combinations thereof.

Figure 9:
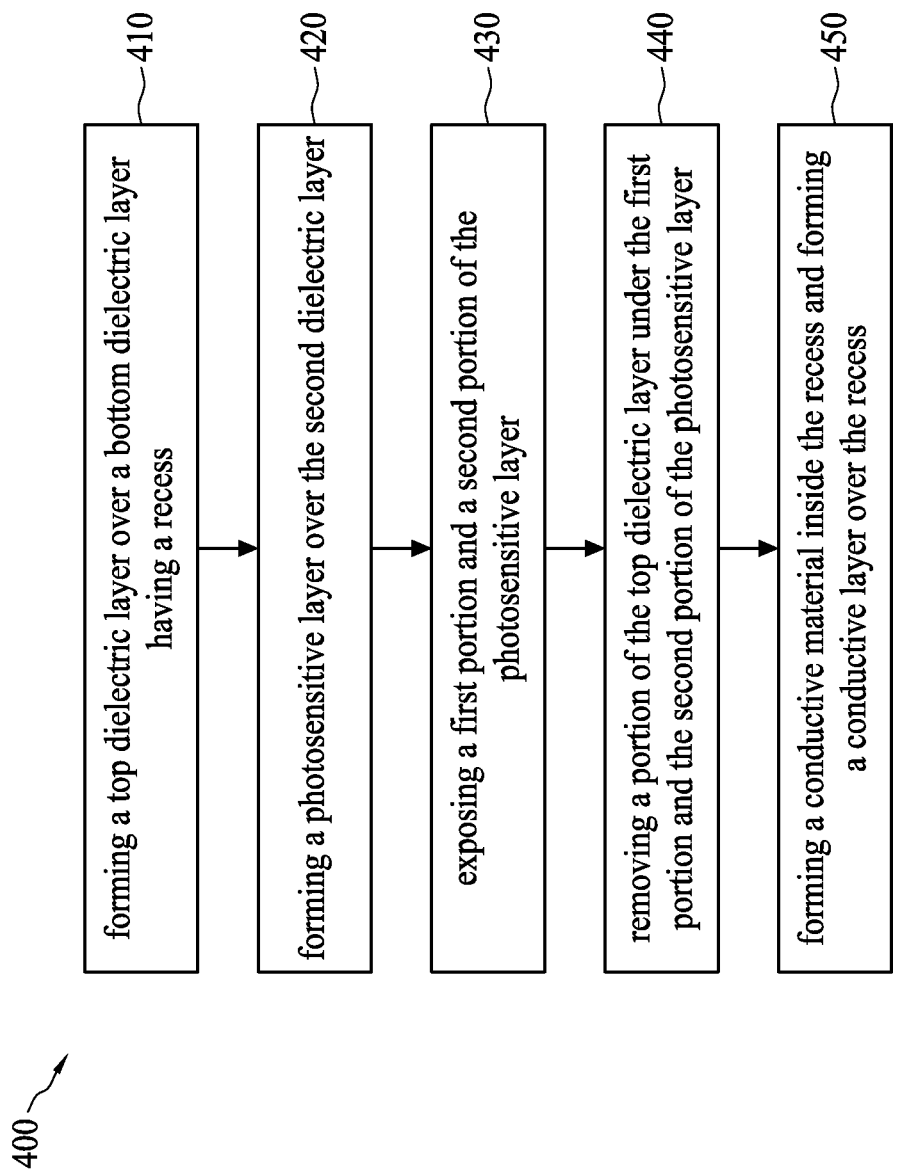
FIGS. 9 to 11 are operations in a method for manufacturing a semiconductor device, in accordance with some embodiments of the present disclosure.
Figure 15:
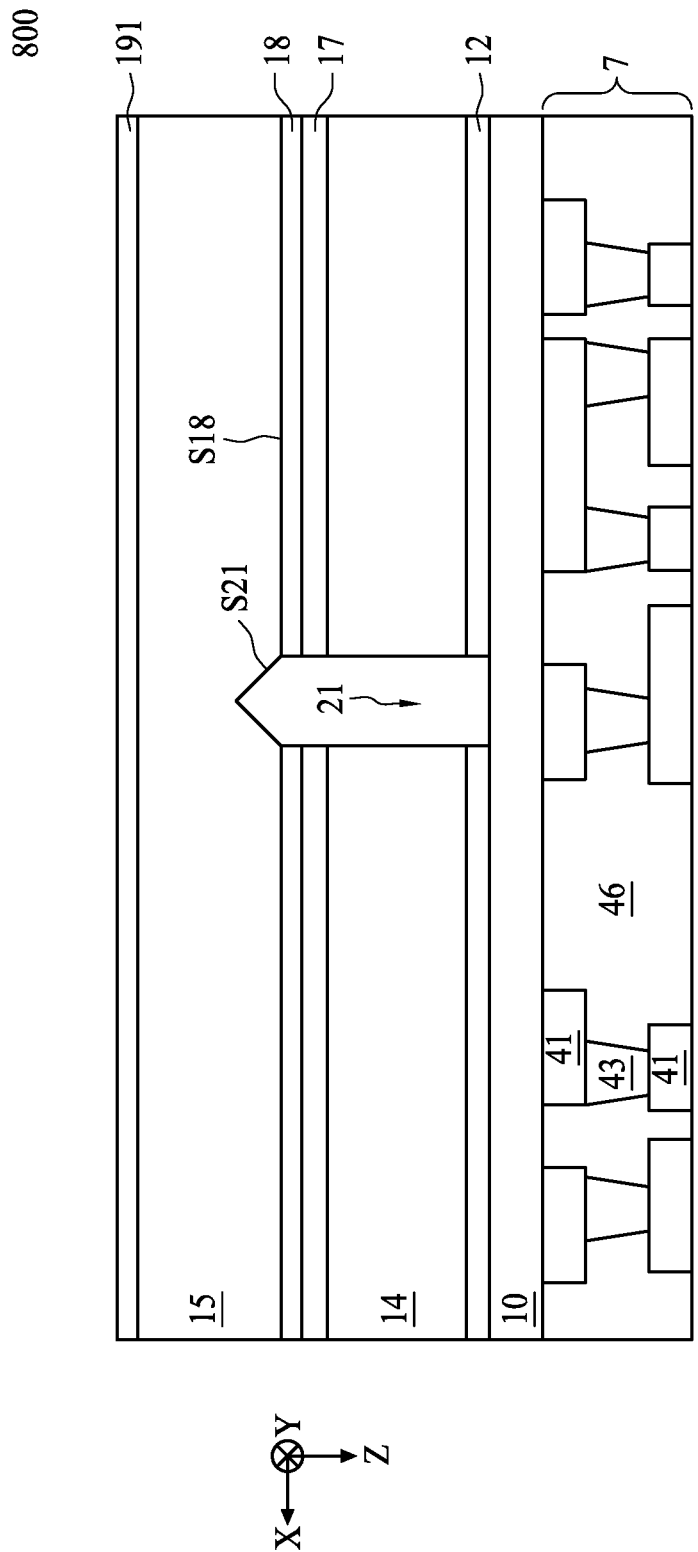
Figure 16:
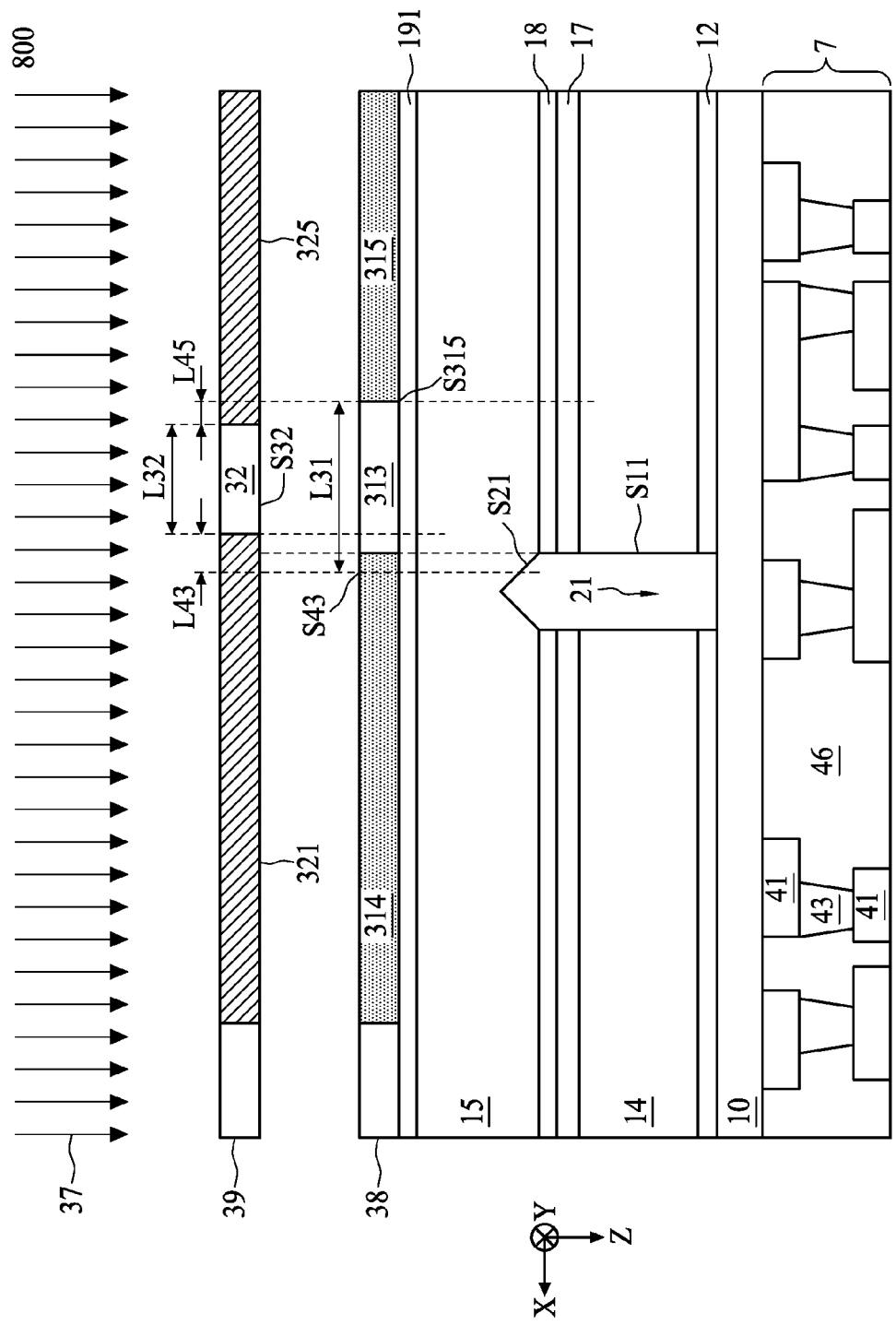
Figure 20:
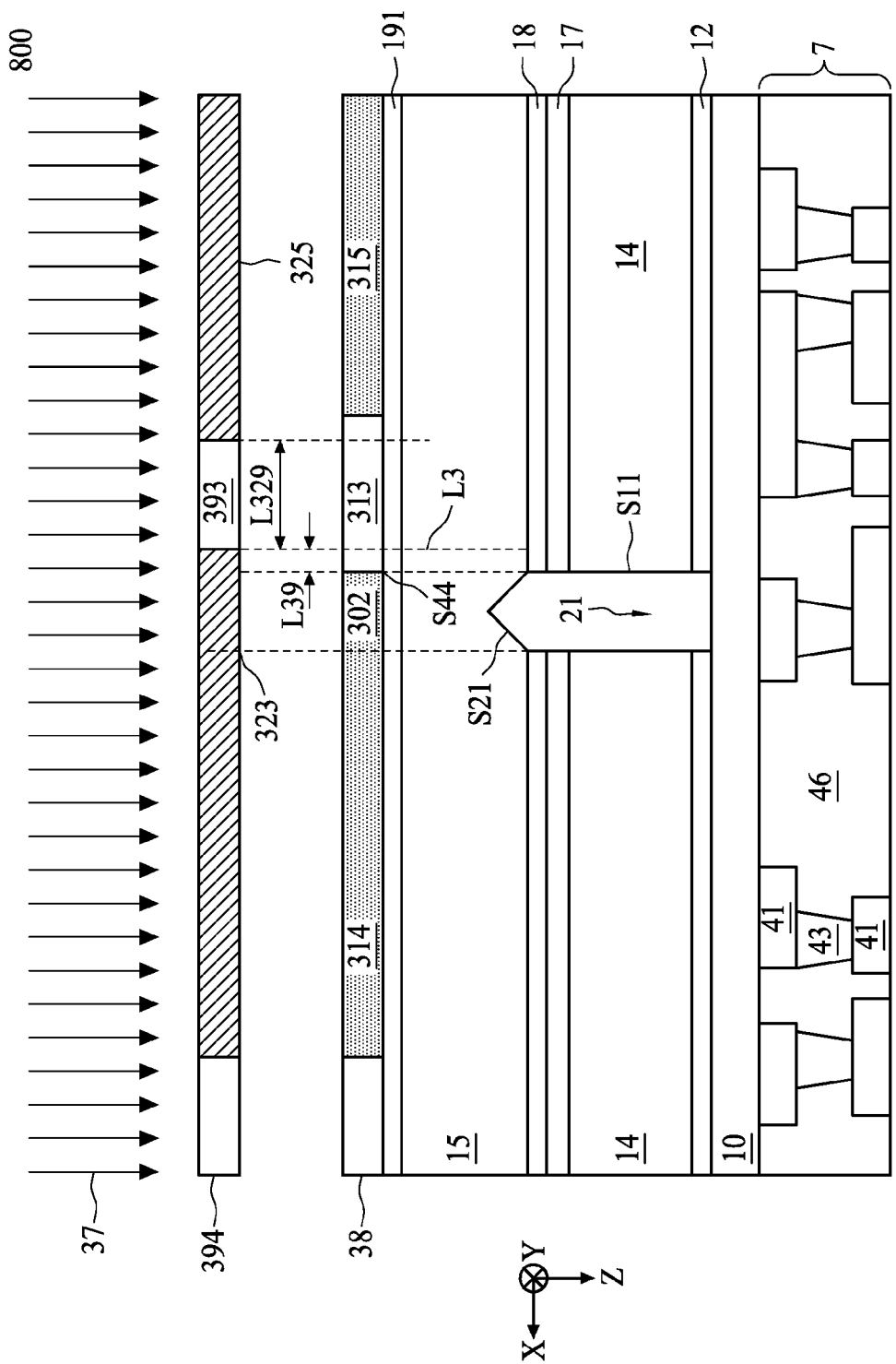
Figure 21A:
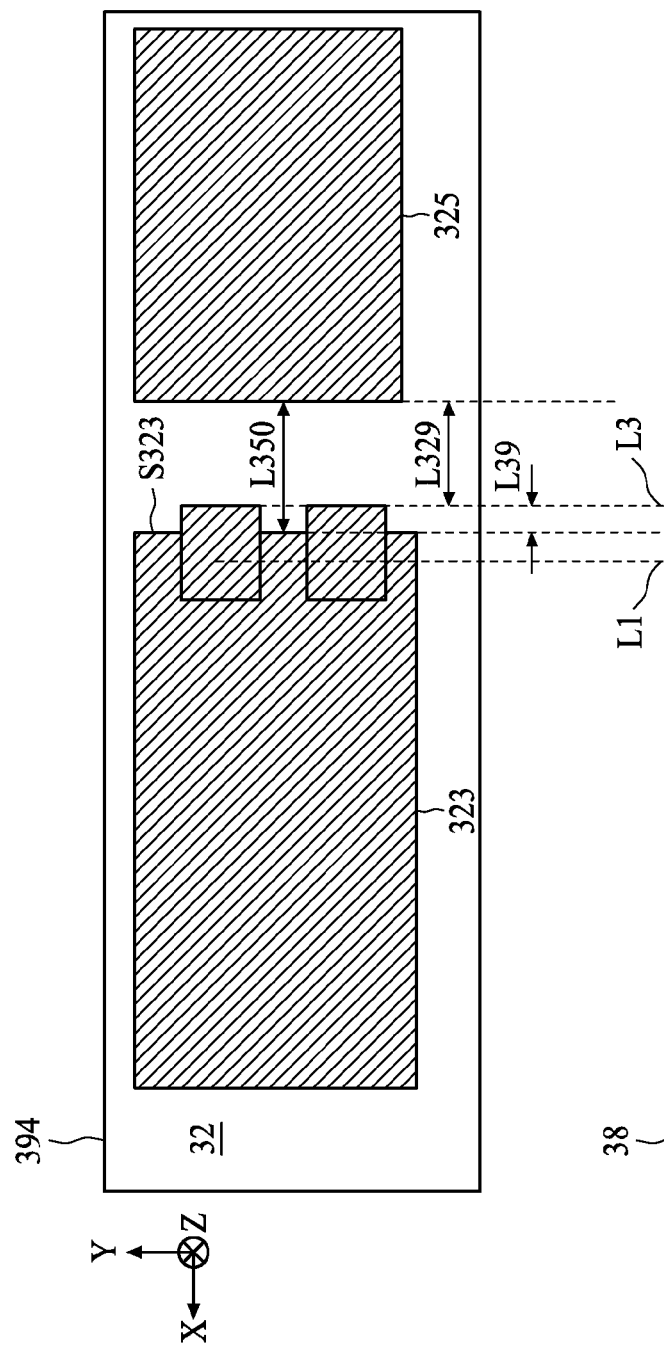
Figure 22:
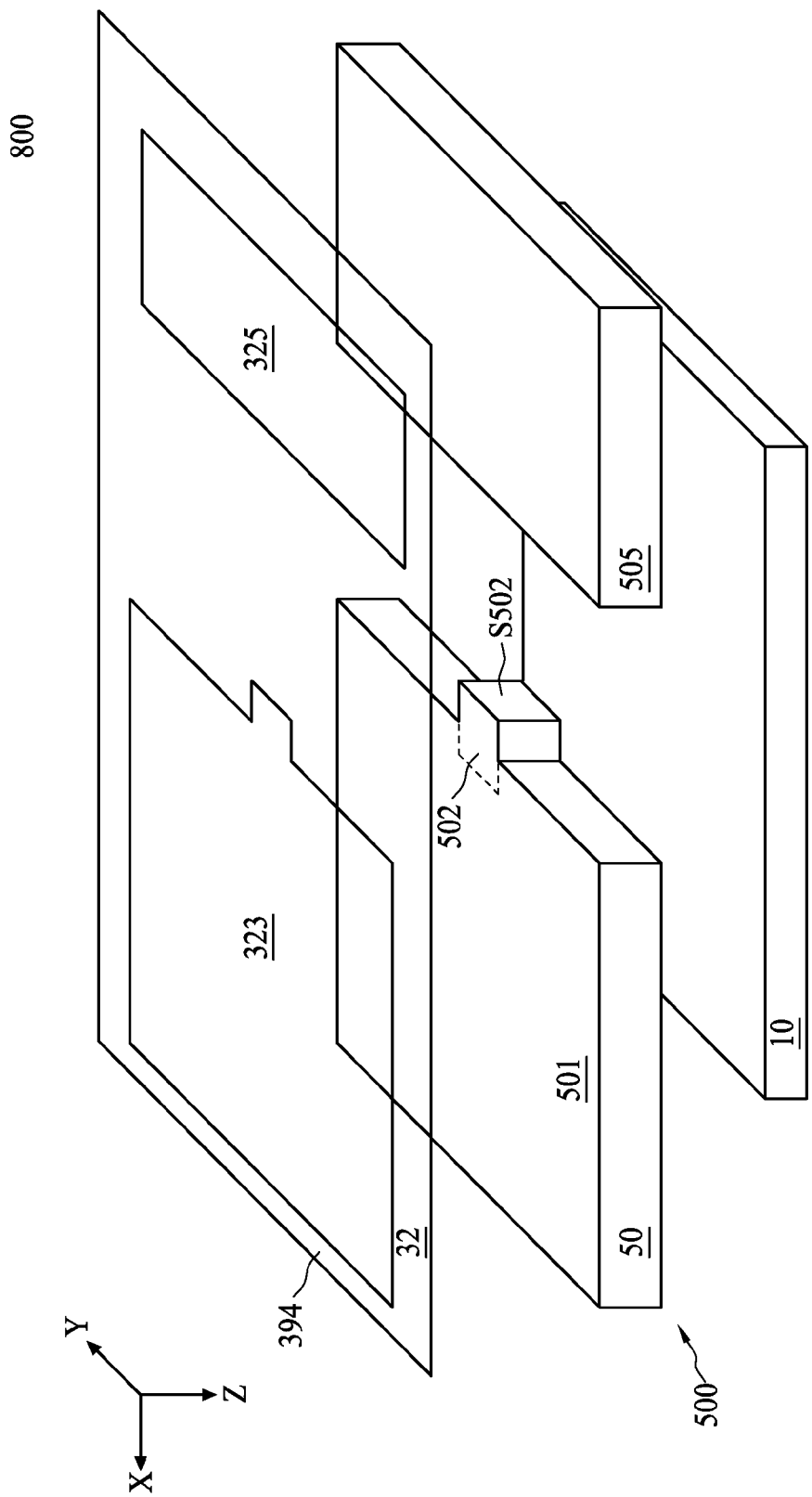
Figure 23:
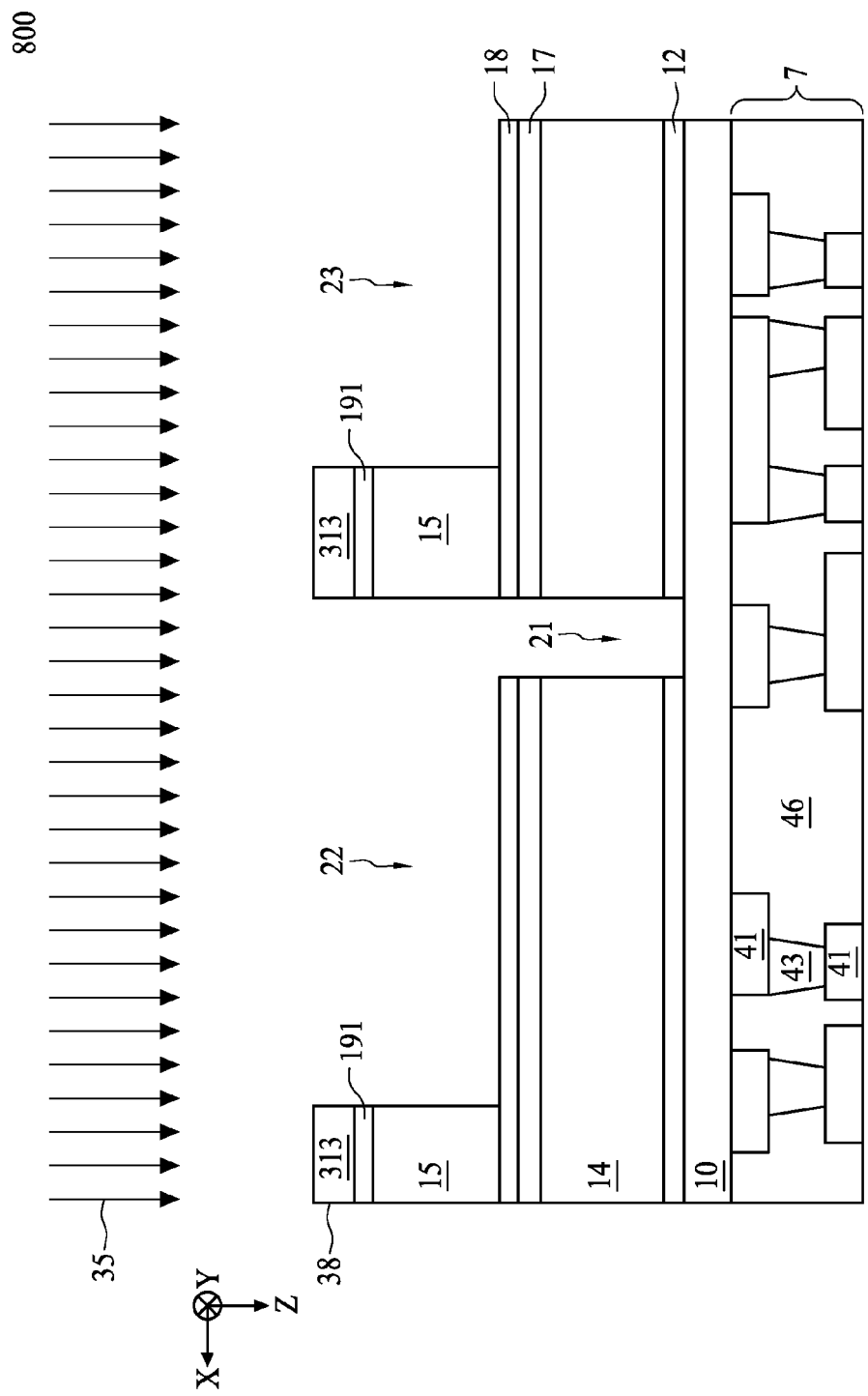
Figure 24:
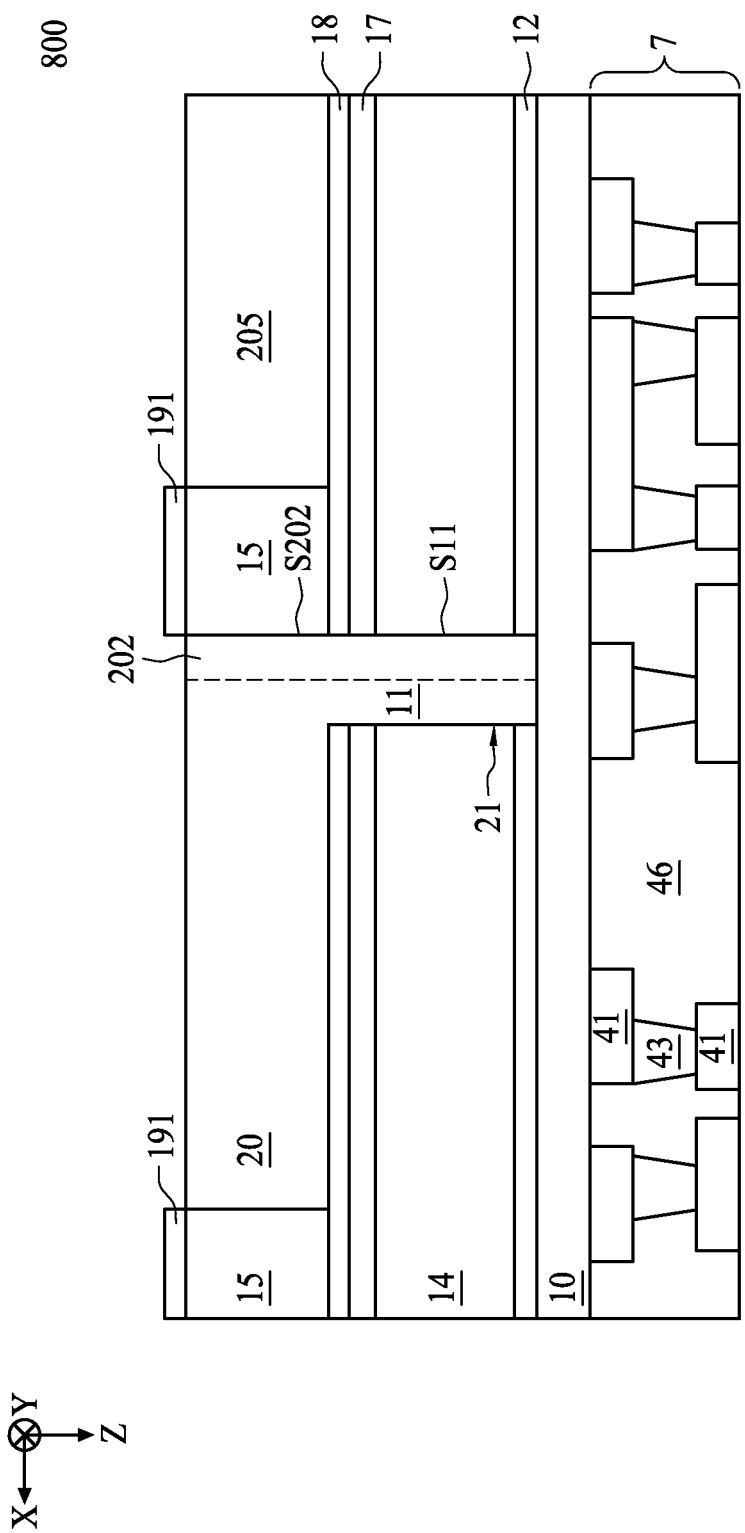
Figure 25A:
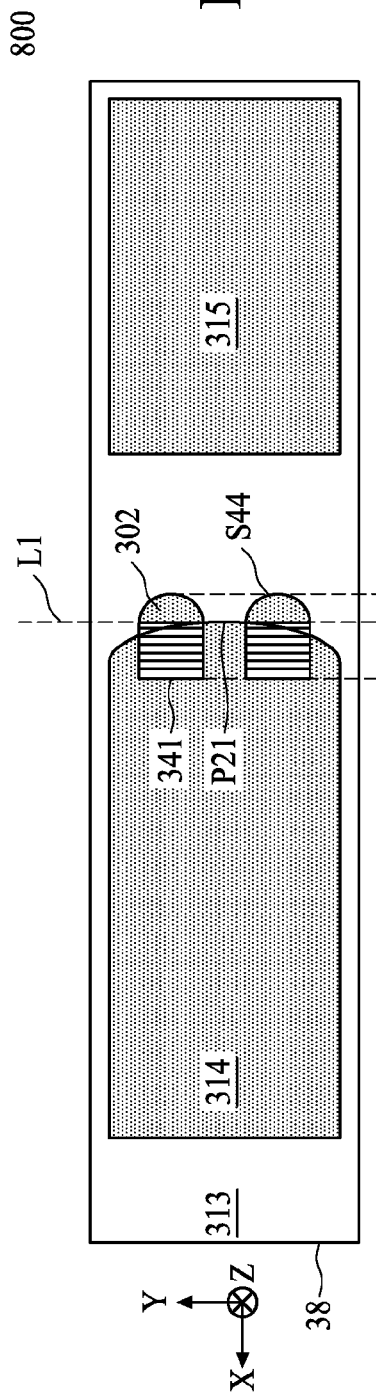

In FIG. 9, a method of manufacturing 400 is illustrated. FIG. 9 illustrates an operation flow for forming the semiconductive device 900 in FIG. 8. Operation 410 forms a top dielectric layer 15 over a bottom dielectric layer 14 having a recess 21. Some exemplary embodiments for operation 410 are illustrated in FIG. 15. Operation 420 forms a photosensitive layer 38 over the second dielectric layer 15. Some exemplary embodiments for operation 420 are illustrated in FIG. 16. Operation 430 exposes a first exposed portion 314 and a second exposed portion 302 of the photosensitive layer 38. Some exemplary embodiments for operation 430 are illustrated in FIGS. 16 to 21AB. Operation 440 removes a portion 501 of the top dielectric layer 15 under the first exposed portion 314 and the second exposed portion 302 of the photosensitive layer 38. Some exemplary embodiments for operation 440 are illustrated in FIGS. 22 and 23. Operation 450 forms a conductive material inside the recess 21. Some exemplary embodiments for operation 460 are illustrated in FIGS. 24 and 25AB. Operation 460 forms a conductive layer 20 over the recess 21. Some exemplary embodiments for operation 460 are illustrated in FIGS. 24 and 25AB.

Figure 10:
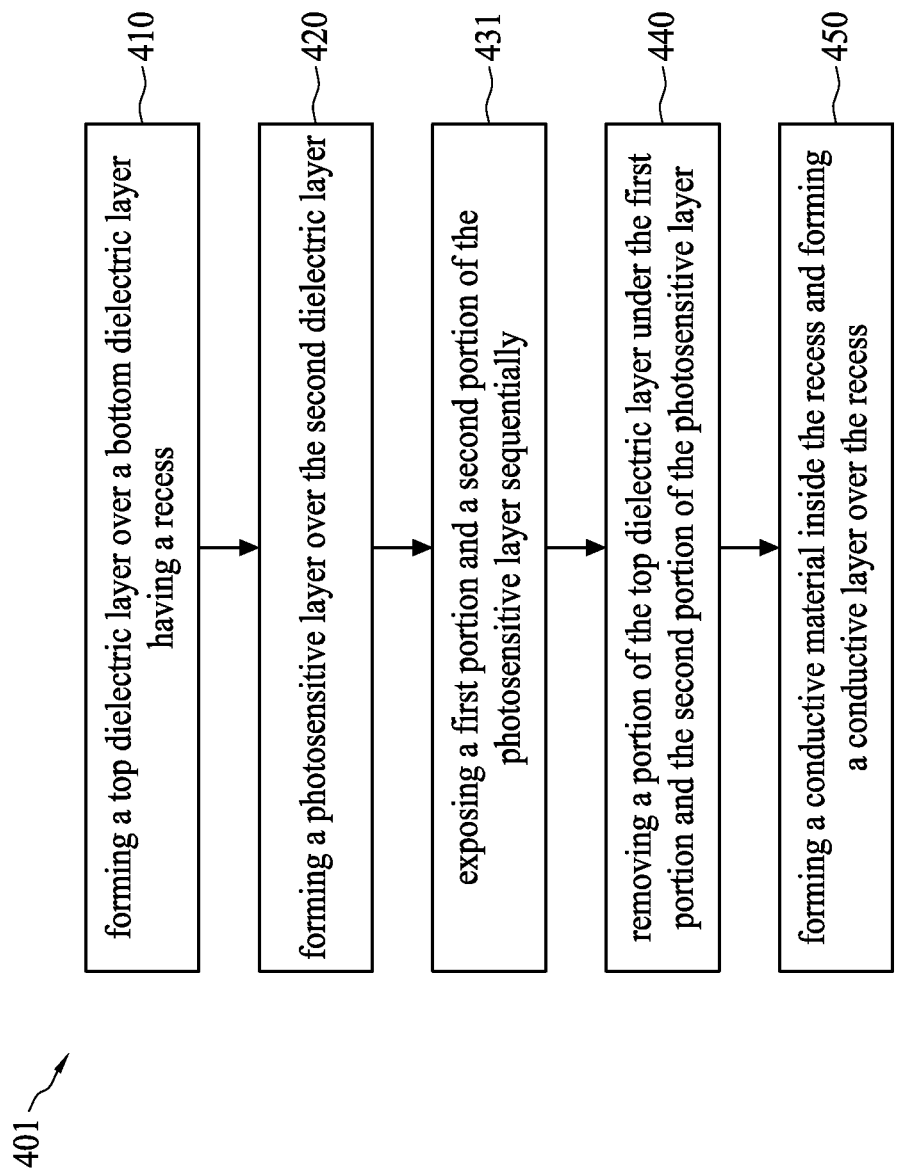

In FIG. 10, a method of manufacturing 401 is illustrated. Method of manufacturing 401 is similar to method of manufacturing 400 except that operation 430 in FIG. 9 is replaced with operation 431. Operation 431 exposes a first exposed portion 314 and a second exposed portion 302 of the photosensitive layer 38 sequentially. Some exemplary embodiments for operation 431 are illustrated in FIGS. 16 to 19AB.

Figure 11:
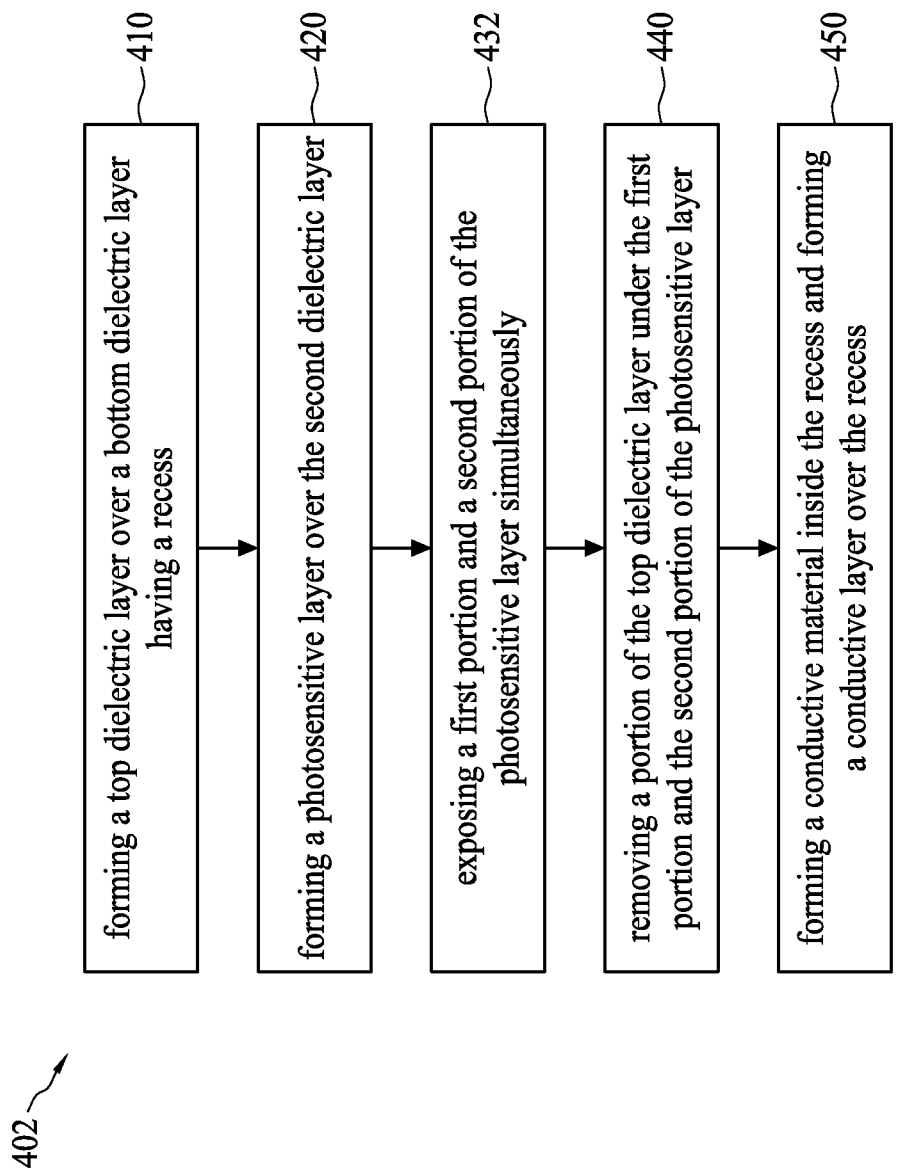

In FIG. 11, a method of manufacturing 402 is illustrated. Method of manufacturing 402 is similar to method of manufacturing 400 except that operation 430 in FIG. 9 is replaced with operation 432. Operation 432 exposes a first exposed portion 314 and a second exposed portion 302 of the photosensitive layer 38 simultaneously. Some exemplary embodiments for operation 432 are illustrated in FIGS. 20 and 21AB.

Figure 12:
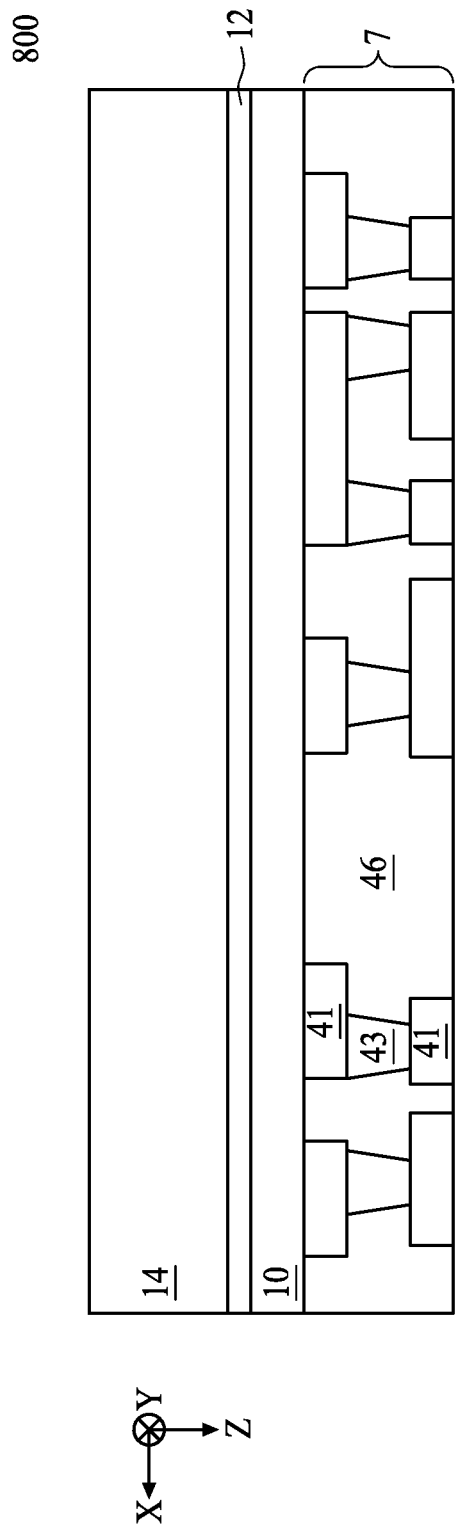
FIGS. 12 to 16, 18, 20, 23, and 24 are cross sectional views of operations in a method for manufacturing a device, in accordance with some embodiments of the present disclosure.

FIG. 12 illustrates a bottom conductive layer 10 being formed on redistribution layer 7 by any suitable method of deposition. Protective layer 12 is formed on top of first conductive layer 10. In some embodiments, protective layer 12 serves as an etch stop layer 12. Bottom dielectric layer 14 is formed on top of protective layer 12 by any suitable method of deposition or epitaxial growth.

Figure 13:
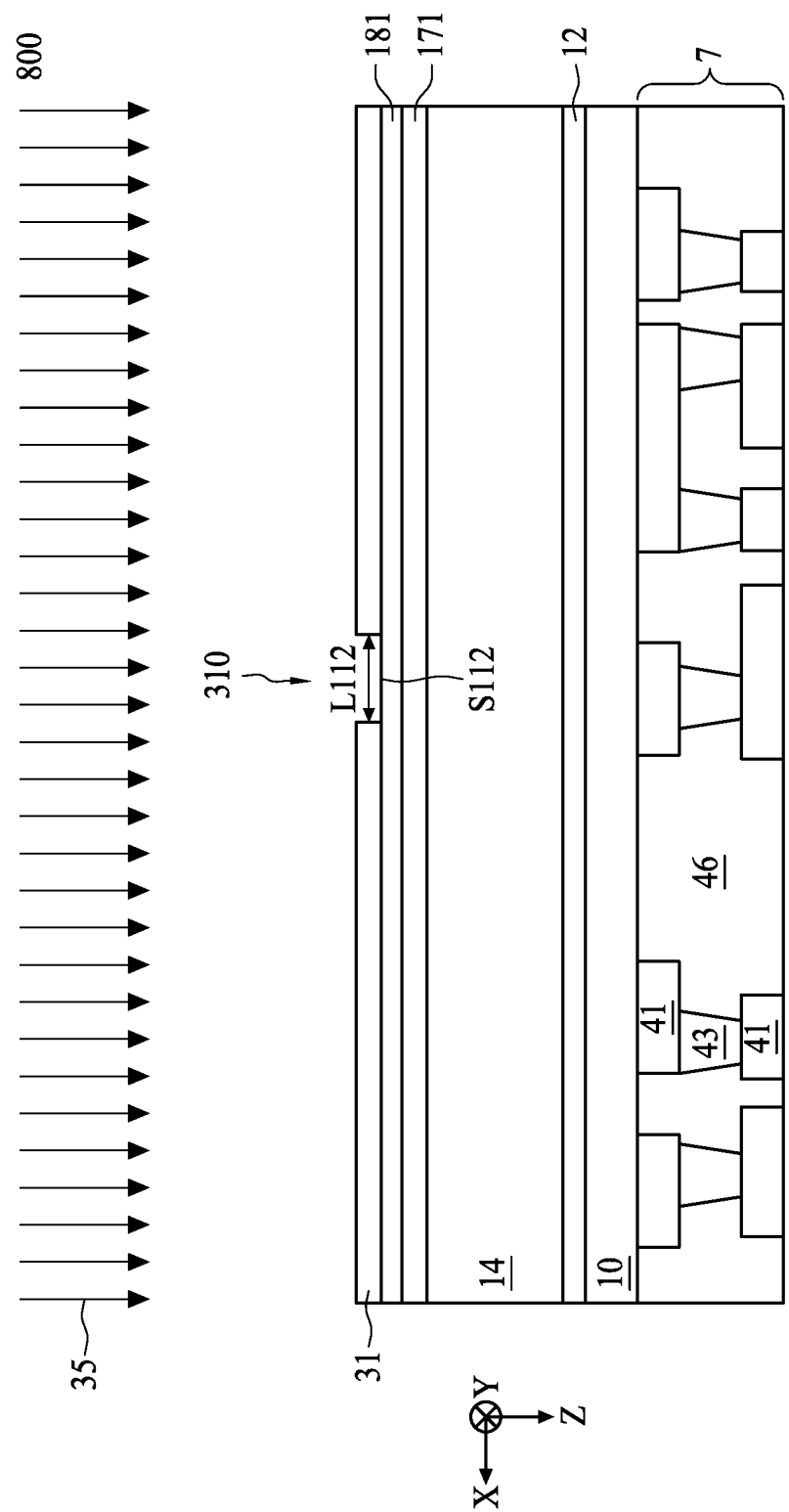

In FIG. 13, etch stop layer 171 is blanket formed on top of bottom dielectric layer 14. Subsequently, a barrier layer 181 is formed over etch stop layer 171. A mask layer 31 is formed on top of barrier layer 181. In some embodiments, mask layer 31 is a photoresist. Mask layer 31 is patterned by any suitable method in a lithography operation. The pattern includes opening 310 in photoresist 31. The opening 310 exposes surface S112. The opening 310 includes a length L112. The lithography operation can be a photolithography operation including forming photoresist 31, exposing photoresist 31 to a pattern, performing a post-exposure bake operation, and developing the photoresist 31 to form a masking element including the photoresist 31.

Figure 14:
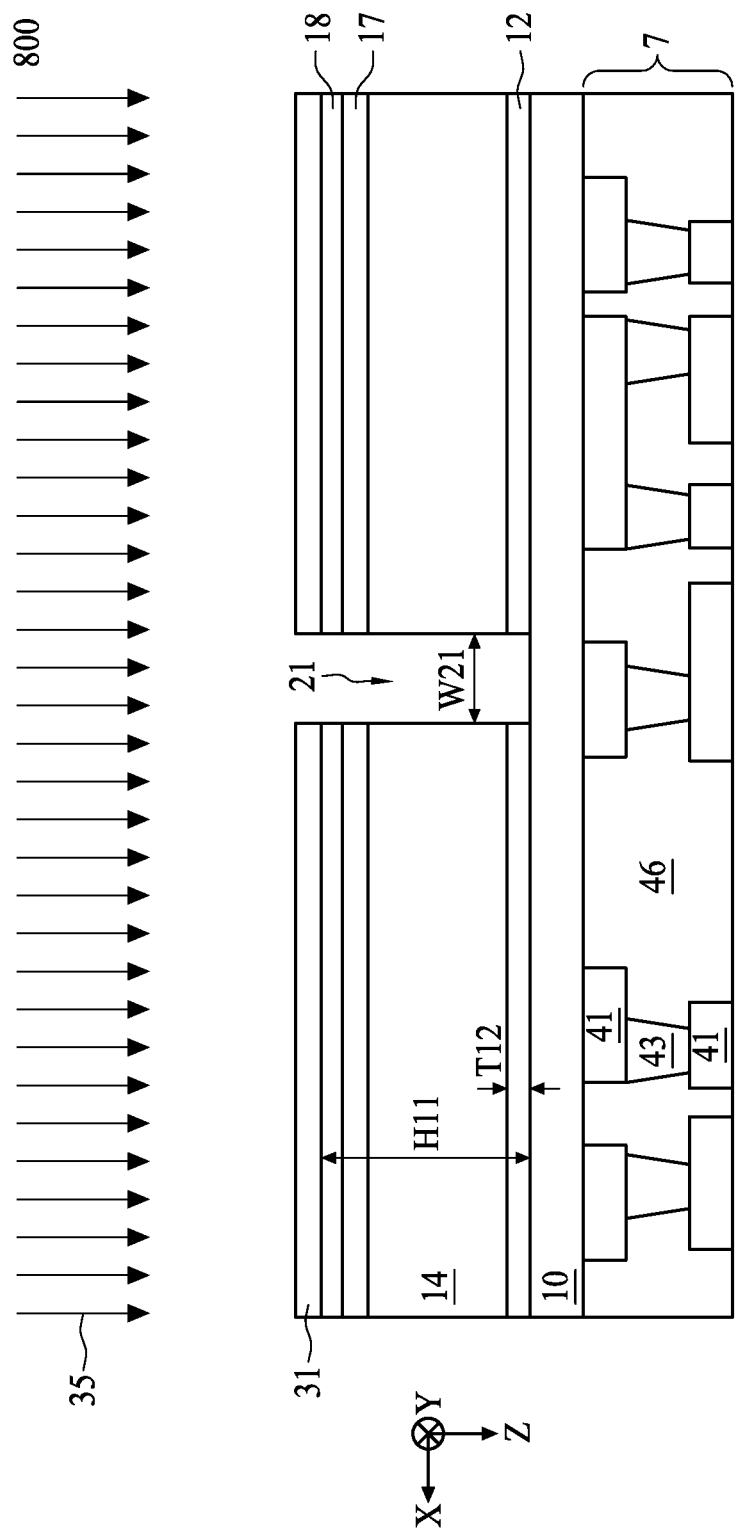

In FIG. 14, a recess 21 is formed. The recess 21 is penetrating through the barrier layer 18 and etch stop layer 17 and reach etch stop layer 12 such that etch stop layer 12 is exposed. The recess 21 is formed by any suitable operation such as etching operation 35. The pattern on the photoresist 31 is transferred by a suitable etching operation to form recess 21 at a certain depth substantially equal to height H11 minus thickness T12. Some suitable etching operation 35 includes dry etching, wet etching, and/or other etching methods (e.g., reactive ion etching). In some embodiments, etching operation 35 is purely chemical (plasma etching), purely physical (ion milling), and/or combinations thereof.

In some embodiments, the etching operation 35 includes multiple etching operations such as selective etchings. The selective etching can use fluorine-containing gas, HBr and/or Cl as etch gases. In some embodiments, a bias voltage used in the etching operation 35 can be adjusted to allow better control of an etching direction to be anisotropic for forming the recess 21, recess. In some embodiments, the selective etching includes a faster etching rate for the barrier layer 18 than for the etch stop layer 17. In some embodiments, the selective etching includes a faster etching rate for the dielectric layer 14 than for the etch stop layer 12. Different etchant can be used for etching different compositions of materials. In some embodiments, recess 21 is formed including a width W21. In some embodiments, width W21 is proximately 0.3 um. After portions of barrier layer 18 and etch stop layer 17 are etched, mask layer 31 is removed.

In some embodiments, recess 21 has a high aspect ratio, which means a small opening at a top and a long recess depth. In some embodiments, the etching operation 35 is a dry etching operation implemented in an etching chamber. The dry etching operation can implement an oxygen-containing gas, fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr, He and/or $CHBR_3$), iodine-containing gas, other suitable gases and/or plasmas, and/or combinations thereof. Further, the dry etching operation can be performed for a suitable duration. Some operation parameters such as etching durations and/or etch rate are adjustable to control the depth of the recess 21. In some embodiments, the depth of recess 21 is around 0.72 um.

In FIG. 15, top dielectric layer 15 is formed over bottom dielectric layer 14 by any suitable method such as epitaxial growth or deposition. Top dielectric layer 15 is formed on top of barrier layer 18. Forming top dielectric layer 15 is by any suitable method such as spin coating USG. In some embodiments, top dielectric layer 15 is formed over bottom dielectric layer 14 including recess 21 such that recess 21 remains void of the dielectric material in top dielectric layer 15. Protective layer 191 is formed over top dielectric layer 15 by any suitable method of deposition.

In FIG. 16, a photosensitive layer 38 is formed over the top dielectric layer 15. Photosensitive layer 38 is formed on top of protective layer 191 by any suitable method such as spin-on coating. In some embodiments, photosensitive layer 38 is a photoresist. In some embodiments, the photoresist is a positive or negative photoresist.

Reticle 39 is aligned over photosensitive layer 38 during lithographic operation. In some embodiments, reticle 39 is a mask 39 above photosensitive layer 38. Reticle 39 is a transparent plate that includes a pattern image to be transferred to the photosensitive layer 38 on semiconductive device 800. Reticle 39 includes transparent portion 321 or transparent portion 325 allowing light ray 37 such as ultraviolet light in exposing operation to pass through transparent portion 321 or 325 and reaching photosensitive layer 38. Reticle 39 includes opaque portion 32 in the pattern image to block light ray 37. Transparent portion 321 is aligned above photosensitive layer 38 such that exposed portion 314 of photosensitive layer 38 is exposed to light ray 37. Transparent portion 325 is aligned above photosensitive layer 38 such that exposed portion 315 of photosensitive layer 38 is exposed to light ray 37. Reticle 39 is aligned such that transparent portion 321 covers over via structure 11. Photosensitive layer 38 is subjected to light ray 37 in the exposing operations. In some embodiments, photosensitive layer 38 is a resist 38 subjected to electron-beam 37 in electron-beam exposure operations.

Optical proximity effects are caused by light diffraction and interference between closely spaced features on reticle 39. For example, transparent portion 321 and transparent portion 325 are distanced by a length L32. Tightly grouped features such as transparent portion 321 and transparent portion 325 affect the real shape of exposed portion 314 and exposed portion 315 to be printed on photosensitive layer 38. Optical proximity effects may lead to shortened line features. For example, exposed portion 314 is shortened from transparent portion 321 by a length L43, and exposed portion 315 is shortened from transparent portion 325 by a length L45. Surface S43 is between exposed portion 314 and covered portion 313. Length L31 is from surface S43 to a surface S315 of exposed portion 315. This particular example is referred to as iso-dense bias. In some embodiments, optical proximity correction (OPC) such as selective image size biases (alterations) are introduced into the pattern of reticle 39 to compensate for the optical proximity effects. Computer algorithms are used for generating optical proximity corrections on the reticle 39 such that length L32 is designed to be shorter than length L31 of covered portion 313. Nonetheless, minimum distance of length L32 is predetermined to avoid forming exposed portion 314 in contact with exposed portion 315.

In FIG. 16, in some embodiments, exposed portion 314 is shortened such that surface S43 is over via opening 21 and that covered portion 313 of photosensitive layer 38 covers over a portion of surface S21 and lateral side S11.

Figures 17A, 17B:
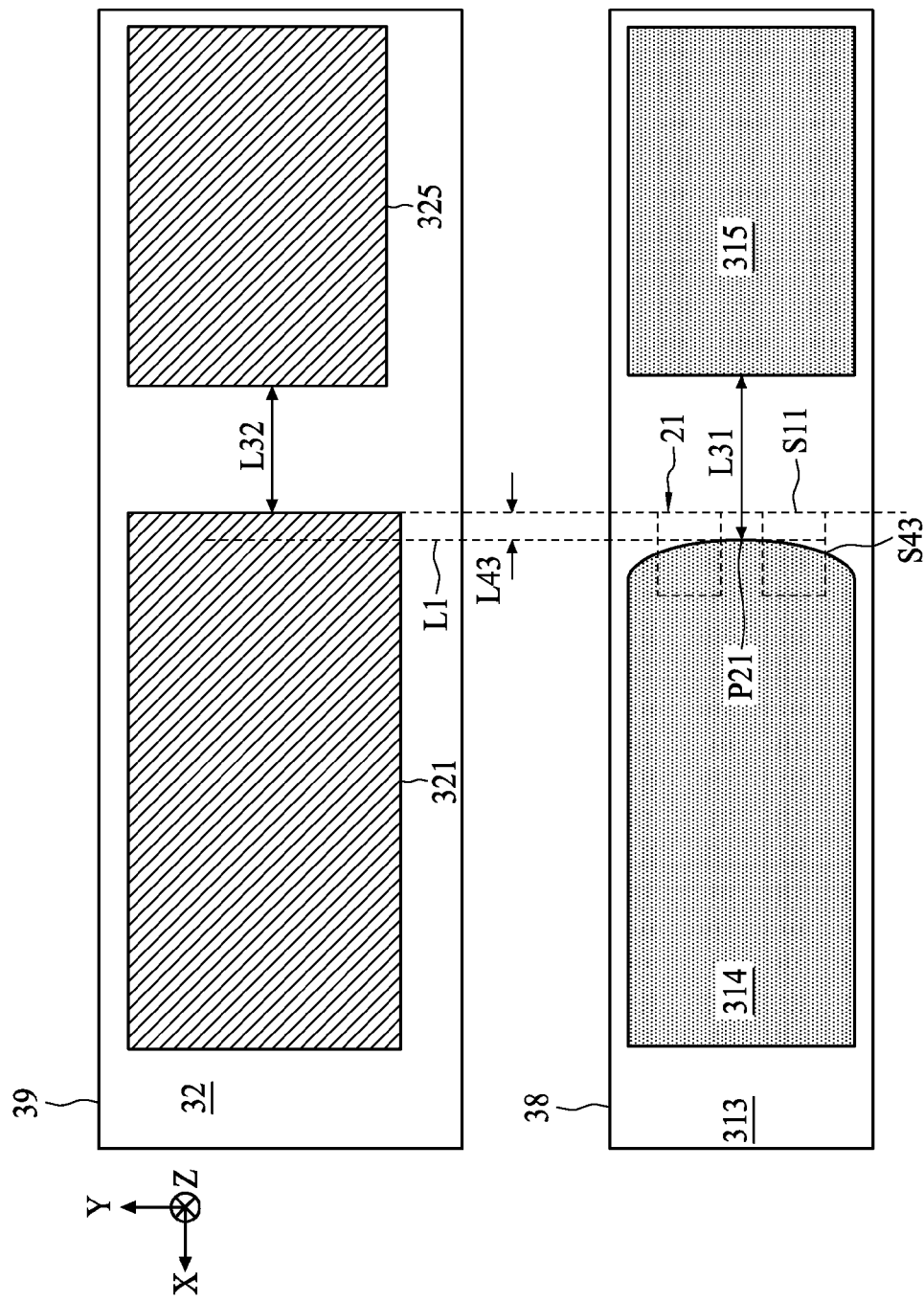
FIGS. 17A, 17B, 19A, 19B, 21A, and 21B are top views of a semiconductor device, in accordance with some embodiments of the present disclosure.

A top view, FIG. 17A, of reticle 39 is aligned with photosensitive layer 38 in FIG. 17B. Exposed portion 314 is shortened such that length L32 of reticle 39 is shorter than length L31 of photosensitive layer 38. Recess 21 is also a via opening 21 illustrated in dash-line because via opening 21 is under exposed portion 314. Via opening 21 is partially under exposed portion 314 such that surface S43 is crossing over via opening 21. In some embodiments, optical proximity effects include rounded corners such that surface S43 is a round curve line. Line L1 is tangent to tip P21 of the round curve line. Length L31 is form a tip of a curve of surface S43 to exposed portion 315. In some embodiments, transparent portion 321 of reticle 39 is aligned to lateral side S11 of via opening 21. In some embodiments, transparent portion 321 extends beyond lateral side S11. Exposed portion 314 is shortened from transparent portion 321 by length L43.

Figure 18:
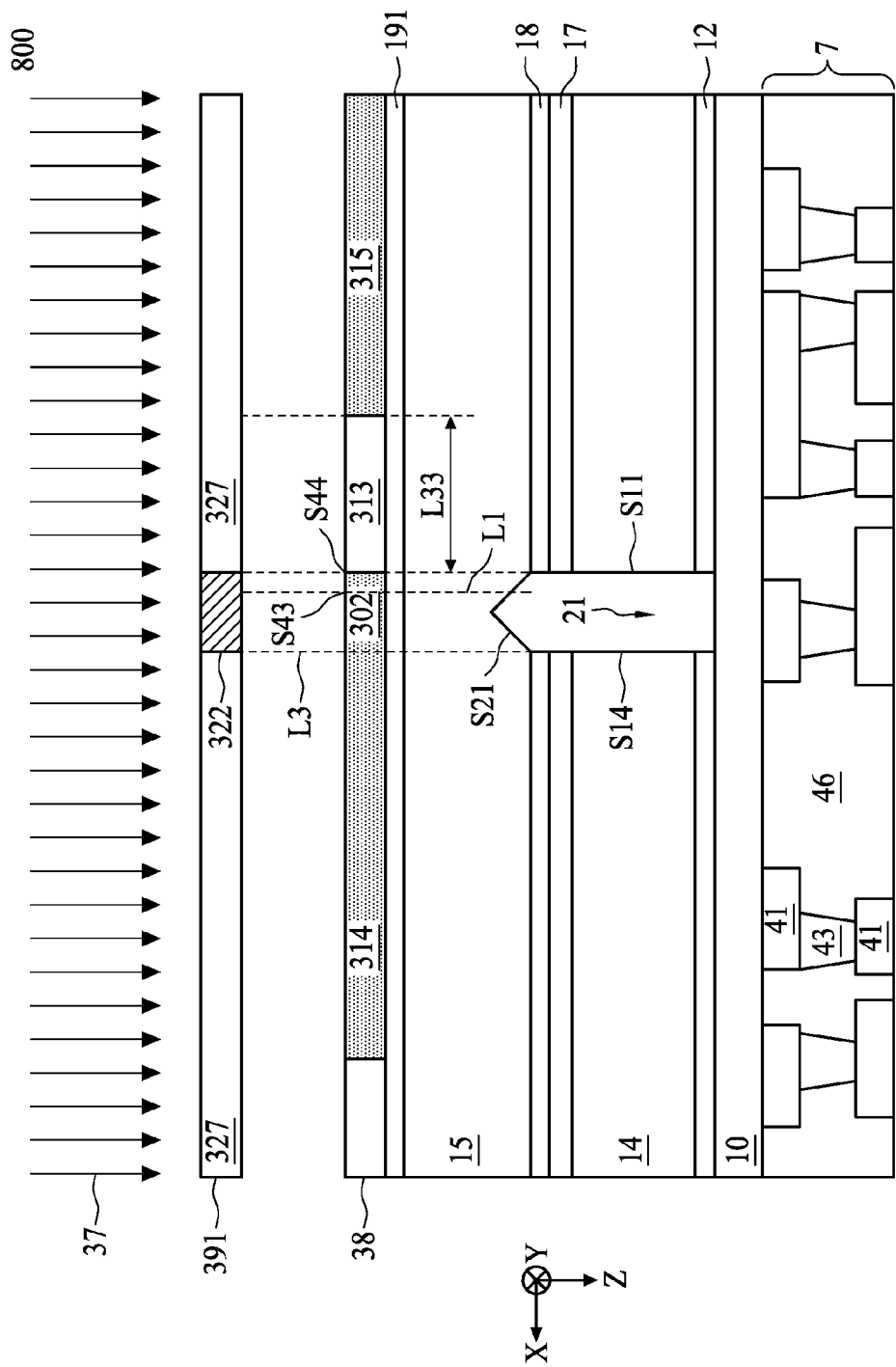

In FIG. 18, another reticle 391 is aligned over photosensitive layer 38 to expose portion 302. Reticle 391 includes transparent portion 322 allowing light ray 37 such as ultraviolet light to pass through transparent portion 322 and reaching photosensitive layer 38. Reticle 391 includes opaque portion 327 in another pattern image to block light ray 37. Opaque portion 327 is aligned above photosensitive layer 38 such that exposed portion 314, covered portion 313 and exposed portion 315 of photosensitive layer 38 are blocked from light ray 37 by opaque portions 327 of photosensitive layer 38. Reticle 391 is aligned such that transparent portion 322 covers over via opening 21. Reticle 391 is aligned such that exposed portion 302 of photosensitive layer 38 is exposed to light ray 37.

In some embodiments, exposed portion 302 is aligned to cover surface S21 of via opening 21. Line L3 is parallel with an interface between exposed portion 302 and exposed portion 314. Line L3 is aligned with side S14 of via opening 21. Exposed portion 302 includes a surface S44. Line L1 is drawn vertically aligned with surface S44. Line L1 or line L3 is parallel with direction Z. Surface S44 is an interface S44 between exposed portion 302 and covered portion 313. Line L1 crosses over via opening 21. Surface S44 is aligned with lateral side S11 or extends to be over top dielectric layer 15. Exposed portion 302 covers up to lateral side S11 of via opening 21. In some embodiments, exposed portion 302 covers over via opening 21 entirely. Exposed portion 302 substantially overlaps with a recess of via opening 21.

Figure 19A:
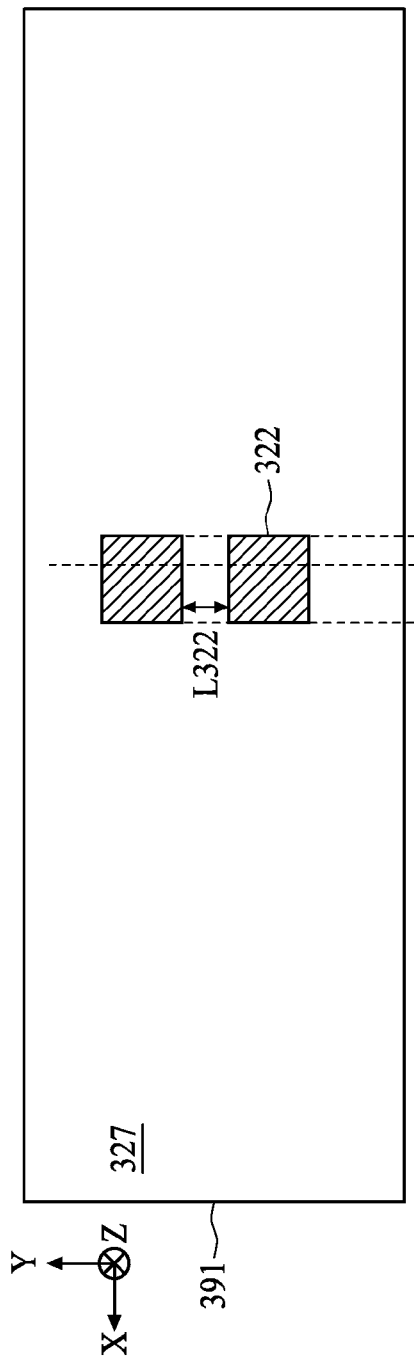
Figure 19B:
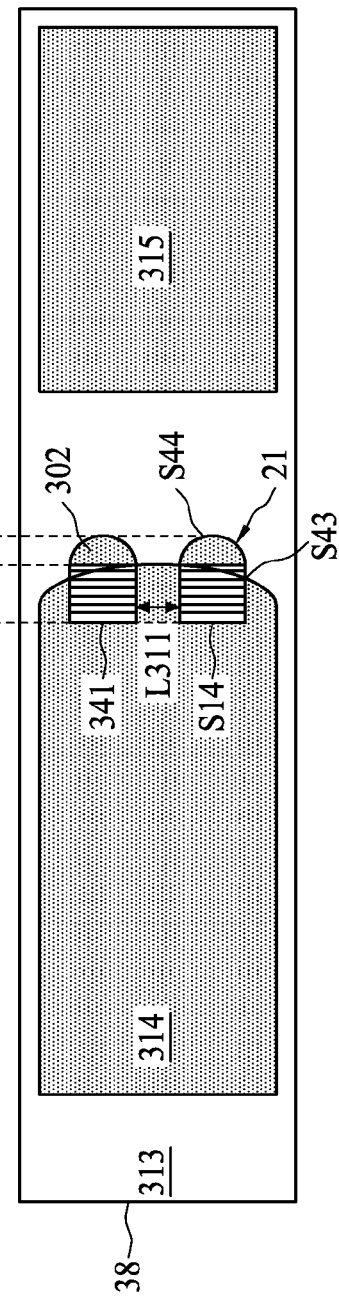

In FIGS. 19A and 19B, in some embodiments, exposed portion 314 is a first exposed portion 314 and exposed portion 302 is a second exposed portion 302. Second exposed portion 302 protruding from first exposed portion 314 in a lateral direction. The lateral direction is orthogonal to direction Z.

A top view, FIG. 19A, of reticle 391 is aligned to a top view, FIG. 19B, of photosensitive layer 38. In reticle 391, opaque portion 327 surrounds transparent portion 322. A length L322 is between transparent portions 322. A length L311 is between exposed portions 302. In some embodiments, length L322 is substantially equal to length L311. In some other embodiments, length L322 is longer than length L311. In some embodiments, a top surface area of transparent portion 322 is larger than or equal to a top surface area of exposed portion 302. In some embodiments, surface S44 includes a round curve. Exposed portion 302 includes a round curve. In some embodiments, exposed portion 302 of photosensitive layer 38 partially overlaps with exposed portion 314 of photosensitive layer 38. An overlapping region 341 is aligned with side S14 of via opening 21.

In some embodiments, in FIG. 10, operation 431 exposes a first exposed portion 314 and a second exposed portion 302 of the photosensitive layer 31 sequentially as illustrated in FIGS. 16 to 19AB. In some embodiments, exposed portion 302 is exposed subsequently after exposed portion 314 is exposed. For example, reticle 39 in FIG. 16 is placed above photosensitive layer 38 before reticle 391 in FIG. 18 is placed above photosensitive layer 38. In some other embodiments, exposed portion 314 is exposed subsequently after exposed portion 302 is exposed. For example, reticle 391 in FIG. 18 is placed above photosensitive layer 38 before reticle 39 in FIG. 16 is placed above photosensitive layer 38.

FIG. 20 illustrates another method of lithographic operation. FIG. 20 is another exemplary embodiment of semiconductive device 900 continued from semiconductive device 800 in FIG. 15. In FIG. 20, operation 432 in FIG. 10 is illustrated. In FIG. 20, exposed portion 314 and exposed portion 302 of the photosensitive layer 38 are exposed simultaneously to light ray 37.

In FIG. 20, a photosensitive layer 38 is formed over the top dielectric layer 15. In some embodiments, the photoresist is a positive or negative photoresist.

Reticle 394 is disposed over photosensitive layer 38 during lithographic operation. In some embodiments, reticle 394 is a mask 394. Reticle 394 includes transparent portion 323 and transparent portion 325 to allow light ray 37 to pass through transparent portion 323 and transparent portion 325 to reach photosensitive layer 38. Transparent portion 323 is aligned above photosensitive layer 38 such that exposed portion 314 and exposed portion 302 of photosensitive layer 38 is exposed to light ray 37. Transparent portion 325 is aligned above photosensitive layer 38 such that exposed portion 315 of photosensitive layer 38 is exposed to light ray 37. Line L3 is an interface between opaque portion 393 and transparent portion 323. Line L3 is over bottom dielectric layer 14. Opaque portion 393 is over bottom dielectric layer 14. Reticle 394 is aligned such that transparent portion 323 covers over via opening 21. In some embodiments, transparent portion 323 extends beyond exposed portion 302 by a predetermined length L39. In some embodiments, exposed portion 314 in FIG. 20 and FIG. 18 are similar in sizes and displacements. In some embodiments, exposed portion 302 in FIG. 20 and FIG. 18 are similar in sizes and displacements.

In some embodiments, optical proximity correction (OPC) such as selective image size biases (alterations) are introduced into the pattern of reticle 394 to compensate for optical proximity effects. Length L329 of opaque portion 393 is from line L3 to transparent portion 325. A minimum distance of length L329 is predetermined to avoid forming exposed portion 302 in contact with exposed portion 315. Transparent portion 323 and transparent portion 325 are distanced by length L329. In some embodiments, length L329 is substantially equal to or lesser than length L33 in FIG. 18. Optical proximity effects include shortening lines. For example, exposed portion 302 of photosensitive layer 38 is shortened from transparent portion 323 of reticle 394 by a length L39. Length L39 is measured laterally in direction X from surface S44 to line L3. Transparent portion 323 and exposed portion 314 are misaligned near lateral side S11 of via opening 21. Exposed portion 315 is shortened from transparent portion 325. Interface S44 is between exposed portion 302 and covered portion 313. In FIG. 20, interface S44 is similarly located as in FIG. 18. Interface S44 extends beyond lateral side S11 by length L39. In some other embodiments, interface S44 is aligned with lateral side S11.

Figure 21B:
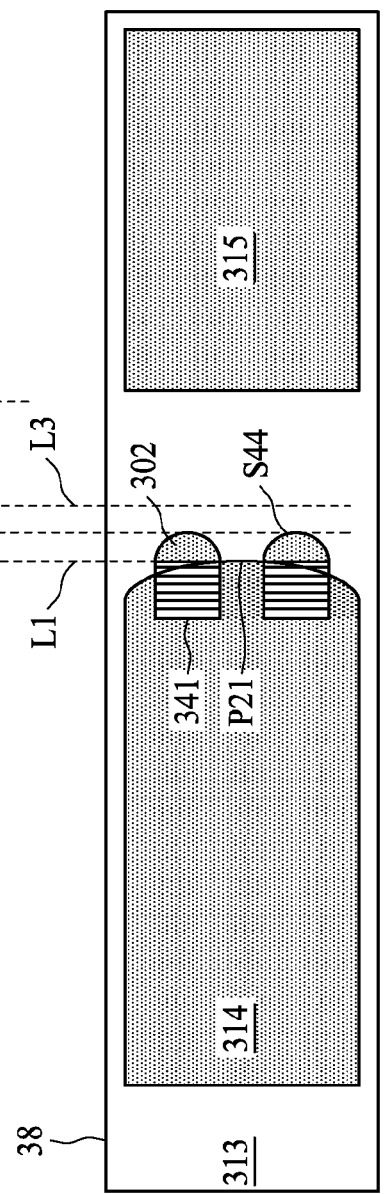

A top view, FIG. 21A, of reticle 394 is aligned to a top view, FIG. 21B, of photosensitive layer 38. In reticle 394, opaque portion 32 surrounds transparent portion 323 and transparent portion 325. Transparent portion 323 includes some protruding portions. The protruding portion is distanced from transparent portion 325 by length L329. Transparent portion 323 includes a lateral edge S323. Lateral edge S323 intersects with the protruding portion. The protruding portion is aligned to line L3. Lateral edge S323 of reticle 394 is distanced from transparent portion 325 by length L350. In some embodiments, exposed portion 302, exposed portion 314, exposed portion 315, or covered portion 313 of photosensitive layer 38 in FIGS. 21A and 21B are similar to exposed portion 302, exposed portion 314, exposed portion 315, or covered portion 313 of photosensitive layer 38 in FIGS. 19A and 19B. Transparent portion 323 of reticle 394 is substantially the same as a combination of transparent portion 322 of reticle 391 in FIGS. 19A and 19B with transparent portion 321 of reticle 39 in FIGS. 17A and 17B.

FIG. 22 is a perspective view of a lithographic operation. Reticle 394 includes transparent portion 323 and transparent portion 325. Transparent portion 323 is over region 500. Region 500 is a combination of portions 501, 502, and 505 above bottom conductive layer 10. Transparent portion 323 includes a shape conformal to an outline of region 500 from a top point of view. Region 500 in semiconductive device 800 is to be removed by suitable etching operation. The region 500 is also to be filled by conductive material to from top conductive layer 20 in FIG. 3.

In FIGS. 16, 18, and 20, in some embodiments, photosensitive layer 38 is a positive resist 38. For a positive resist 38, exposed portion 314, 302, or 315 of the photosensitive layer 38 is exposed to light ray 37 and becomes soluble to a photoresist developer. A portion such as covered portion 313 of the photosensitive layer 38 is unexposed and remains insoluble to the photoresist developer. For a negative resist 38, covered portion 313 of the photosensitive layer 38 switches to become exposed to light ray 37 and to become insoluble to a photoresist developer. A portion such as exposed portion 314, 302, or 315 of the photosensitive layer 38 switches to become unexposed to remain soluble to the photoresist developer.

In the exposure operations, photosensitive layer 38 is exposed through reticle 39, 391, or 394 in FIG. 16, 18, or 20. The soluble portion of photosensitive layer 38 is removed by the developing solution. The insoluble portion such as covered portion 313 is cured through baking to form the pattern image. The insoluble portion is hardened and remained on top of protective layer 191 over top dielectric layer 15.

In FIG. 23, etching operation 35 is performed over photosensitive layer 38. Etching operation 35 is to transfer the pattern image of covered portion 313 to underlying layers such as protective layer 191 or top dielectric layer 15. In some embodiments, etching operation 35 is performed to form recess 22 and recess 23. Etching operation 35 removes some portions of top dielectric layer 15 similar to portions 501, 502, or 503 in FIG. 22

When the portions of top dielectric layer 15 are removed, the etching operation 35 changes to etching etch stop layer 12. A form of endpoint detection includes measuring different parameters such as a change in etching rate, or a change in a color of plasma from the etching operation 35. In some embodiments, a change in the color of plasma from etching the portion of top dielectric layer 15 to etching the portion of etch stop layer 12 near via opening 21 can be observed by using an optical system to indicate a detection of endpoint.

In some other embodiments, a form of endpoint detection is to determine when a reaction operation is complete by monitoring a level of a byproduct originates from top dielectric layer 15 under the etching operation 35. A completion of removing top dielectric layer 15 is indicated by a sharp drop in the level of the byproduct.

In some embodiments, etching operation 35 is performed to remove a portion of etch stop layer 12 near via opening 21 such that etch stop layer 12 at a bottom of via opening 21 is exposed.

In some embodiments, the etching operation 35 is a selective etching. The selective etching can use fluorine-containing gas, HBr and/or $Cl_2$ as etch gases. In some embodiments, a bias voltage used in the etching operation 35 can be adjusted to allow better control of an etching direction to be anisotropic for forming the recess 22, recess 23, or via opening 21. In some embodiments, the selective etching includes a faster etching rate for the top dielectric layer 15 than for the barrier layer 18. In some embodiments, the selective etching includes a faster etching rate for the etch stop layer 12 than for the bottom conductive layer 10. Different etchant can be used for etching different compositions of materials. After the portion of etch stop layer 12, the portions of top dielectric layer 15, or protective layer 191 is etched, covered portion 313 of photosensitive layer 38 is removed.

Any suitable conductive material is filling inside via opening 21, recess 22, or recess 23 by any suitable method such as deposition operation or epitaxial growth.

In FIG. 24, via structure 11, top conductive layer 20, and region 205 are formed by any suitable operation of deposition such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) operation, thermal oxidation, UV-ozone oxidation, epitaxial growth methods (e.g., selective epitaxy growth), sputtering, plating, spin-on coating, other suitable methods, and/or combinations thereof. Via structure 11 is formed on top of bottom conductive layer 10 such that top conductive layer 20 is electrically coupled with bottom conductive layer 10 through via structure 11.

Figure 25B:
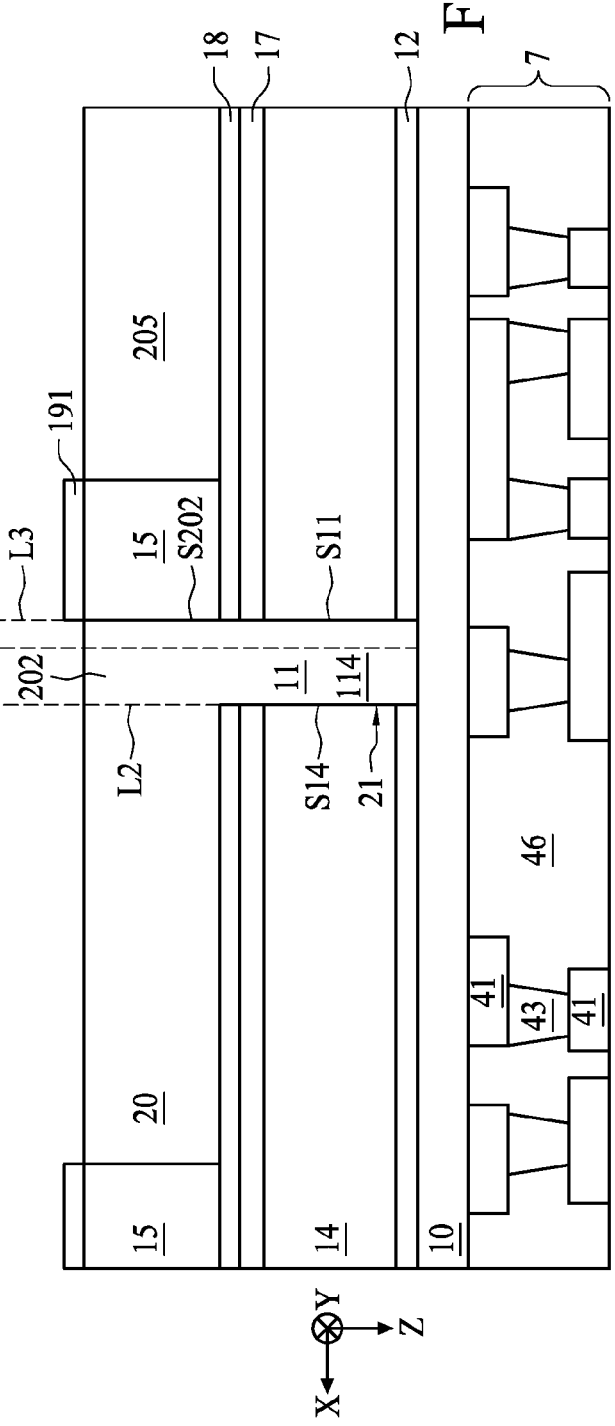

A top view, FIG. 25A of photosensitive layer 38 aligned to top view, FIG. 25B, of conductive layer 20 and region 205. Line L3 is aligned to the tip of exposed portion 302 and lateral side S11 of via structure 11. Line L1 is aligned to tip P21 of exposed portion 314 and back portion 114 of via structure 11. Line L2 is aligned to side S14 of back portion 114 and to overlapping region 341.

Some embodiments of the present disclosure provide a semiconductive device. The semiconductive device includes a first conductive layer and a second conductive layer above the first conductive layer. The second conductive layer includes a first portion and a second portion protruding from the first portion. A via structure is under the second conductive layer and on top of the first conductive layer. The via structure is substantially aligned vertically with the second portion.

Some embodiments of the present disclosure provide a semiconductive device. The semiconductive device includes a first conductive layer and a via structure on top of the first conductive layer. The via structure includes a lateral side and a second conductive layer over the via structure. The second conductive layer includes a lateral boundary connected to the lateral side of the via structure such that a first portion of the lateral boundary is aligned vertically with the lateral side of the via structure. A protective layer is over the first conductive layer and surrounding the via structure in proximity to the first conductive layer.

Some embodiments of the present disclosure provide a method of manufacturing a semiconductive device. The method includes forming a top dielectric layer over a bottom dielectric layer having a recess; forming a photosensitive layer over the top dielectric layer; and exposing a first portion and a second portion of the photosensitive layer. The second portion is protruding from the first portion in a lateral direction, and the second portion is substantially overlaps with the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductive device, comprising:
 a first conductive layer;
 a second conductive layer above the first conductive layer, and the second conductive layer comprising:
  a first portion; and
  a second portion protruding from the first portion; and
 a via structure under the second conductive layer and on top of the first conductive layer, and the via structure substantially aligned vertically with the second portion, wherein the second conductive layer is an ultra-thick metal layer.

2. The semiconductive device of claim 1, wherein the first portion partially overlaps with the second portion.

3. The semiconductive device of claim 1, wherein the first portion of the second conductive layer comprises a curved boundary intersecting with the second portion.

4. The semiconductive device of claim 1, wherein the second conductive layer further comprises a third portion, and the third portion being distanced from the first portion by a predetermined value.

5. The semiconductive device of claim 1, wherein the via structure comprises a material substantially the same as the material of the second conductive layer.

6. The semiconductive device of claim 1, wherein the via structure is in contact with the first conductive layer.

7. The semiconductive device of claim 1, further comprising a protective layer over the first conductive layer and surrounding only a portion of the via structure in proximity to the first conductive layer.

8. A semiconductive device, comprising:
   a first conductive layer;
   a via structure on top of the first conductive layer, and the via structure comprising a lateral side;
   a second conductive layer over the via structure, and the second conductive layer comprising:
      a lateral boundary connected to the lateral side of the via structure such that a first portion of the lateral boundary is aligned vertically with the lateral side of the via structure; and
      a protective layer over the first conductive layer and surrounding the via structure in proximity to the first conductive layer.

9. The semiconductive device of claim 8, wherein the first portion of the lateral boundary is substantially in contact with the lateral side.

10. The semiconductive device of claim 8, wherein the first portion of the lateral boundary comprises a protruding portion.

11. The semiconductive device of claim 8, wherein the second conductive layer comprises another region distanced from the first portion of the lateral boundary by a predetermined value.

12. The semiconductive device of claim 8, wherein the via structure comprises a conductive material similar to a material in the second conductive layer.

13. The semiconductive device of claim 8, wherein the lateral side of the via structure is in contact with the first conductive layer.

14. The semiconductive device of claim 8, wherein the protective layer comprises nitride materials.

15. A semiconductive structure, comprising:
   a first conductive layer;
   a second conductive layer above the first conductive layer, the second conductive layer comprising:
      a body region, comprising:
         a first portion; and
         a second portion protruding from the first portion; and
      a side region adjacent to the body region; and
   a via structure under the second conductive layer and on top of the first conductive layer, and a via of the via structure substantially aligning vertically with the second portion,
   wherein a minimal distance between the first portion and the side region is greater than a minimal distance between the second portion and the side region.

16. The semiconductive structure of claim 15, wherein the second conductive layer comprises a thickness greater than about 2 µm.

17. The semiconductive structure of claim 15, wherein a lateral side of the second portion is vertically aligned with a lateral side of the via of the via structure.

18. The semiconductive structure of claim 15, wherein the first portion of the second conductive layer comprises a curved boundary intersecting with the second portion.

19. The semiconductive structure of claim 15, wherein the second conductive layer further comprising a third portion protruding from the first portion.

20. The semiconductive structure of claim 19, wherein a lateral side of the third portion is vertically aligned with a lateral side of a via of the via structure.

* * * * *